(12) United States Patent
Ando et al.

(10) Patent No.: US 10,873,311 B2
(45) Date of Patent: Dec. 22, 2020

(54) ACOUSTIC RESONATORS WITH REDUCED LOSS CHARACTERISTICS AND METHODS OF MANUFACTURING SAME

(71) Applicant: SKYWORKS SOLUTIONS, INC., Woburn, MA (US)

(72) Inventors: Yoshiaki Ando, Yokosuka (JP); Satoshi Niwa, Taito-Ku (JP); Hiroyuki Nakamura, Osaka-Fu (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 34 days.

(21) Appl. No.: 15/894,021

(22) Filed: Feb. 12, 2018

(65) Prior Publication Data
US 2018/0234076 A1    Aug. 16, 2018

Related U.S. Application Data

(60) Provisional application No. 62/459,351, filed on Feb. 15, 2017.

(51) Int. Cl.
*H03H 9/02* (2006.01)
*H03H 9/70* (2006.01)
(Continued)

(52) U.S. Cl.
CPC .......... *H03H 9/02086* (2013.01); *H03H 3/02* (2013.01); *H03H 9/1014* (2013.01); *H03H 9/13* (2013.01); *H03H 9/205* (2013.01); *H03H 9/54* (2013.01); *H03H 9/587* (2013.01); *H03H 9/605* (2013.01); *H03H 9/706* (2013.01); *H04B 1/40* (2013.01)

(58) Field of Classification Search
CPC .... H03H 9/02086; H03H 9/1014; H03H 9/13; H03H 9/205; H03H 9/54; H03H 9/587; H03H 9/605; H03H 9/706; H03H 3/02
See application file for complete search history.

(56) References Cited

U.S. PATENT DOCUMENTS

2006/0012021 A1* 1/2006 Larson, III ............. H03B 5/326
                                                              257/686
2009/0101999 A1* 4/2009 Fazzio ..................... H03H 3/02
                                                              257/416

(Continued)

*Primary Examiner* — Samuel S Outten
(74) *Attorney, Agent, or Firm* — Lando & Anastasi, LLP

(57) ABSTRACT

An acoustic resonator that prevents a radio frequency (RF) signal from being coupled to a cap substrate. An electronic device includes a first substrate (device substrate) of piezoelectric material having a top surface on which an electronic circuit including a film bulk acoustic resonator is formed, a second substrate (cap substrate) of low-resistivity material, a bottom surface of which is disposed opposing the top surface of the first substrate, and a side wall disposed between the top surface of the first substrate and the bottom surface of the second substrate. The side wall defines a cavity together with the top surface of the first substrate and the bottom surface of the second substrate, the cavity internally including the electronic circuit. A thin film of high-resistivity material is formed on at least a portion of the bottom surface of the second substrate to prevent an RF signal emitted from the electronic circuit from being coupled to the second substrate.

32 Claims, 18 Drawing Sheets

(51) Int. Cl.
*H03H 9/54* (2006.01)
*H03H 9/13* (2006.01)
*H03H 3/02* (2006.01)
*H03H 9/205* (2006.01)
*H03H 9/10* (2006.01)
*H03H 9/58* (2006.01)
*H03H 9/60* (2006.01)
*H04B 1/40* (2015.01)

(56) References Cited

U.S. PATENT DOCUMENTS

| | | | |
|---|---|---|---|
| 2011/0210787 A1* | 9/2011 | Lee | H03F 1/56 |
| | | | 330/126 |
| 2013/0313947 A1* | 11/2013 | Chen | H03H 3/007 |
| | | | 310/348 |
| 2017/0077900 A1* | 3/2017 | Park | H01L 41/23 |
| 2017/0125641 A1* | 5/2017 | Jeon | H01L 33/382 |

* cited by examiner

ACOUSTIC RESONATORS WITH REDUCED LOSS CHARACTERISTICS AND METHODS OF MANUFACTURING SAME

CROSS REFERENCE TO RELATED APPLICATIONS

This application claims priority under 35 U.S.C. § 119(e) to U.S. Provisional patent Application Ser. No. 62/459,351, titled "ACOUSTIC RESONATORS WITH REDUCED LOSS CHARACTERISTICS AND METHODS OF MANUFACTURING SAME," filed on Feb. 15, 2017, which is incorporated by reference herein in its entirety for all purposes.

BACKGROUND

Conventionally, in a communication device such as a mobile phone, a filter device has been used to separate signals having different bands, such as a transmission signal and a reception signal. An electronic device including a bulk acoustic wave (BAW) resonator such as a film bulk acoustic resonator (FBAR) or a solidly mounted resonator (SMR) has been used in the filter device.

FIG. 1 is a cross-sectional view schematically showing a configuration of an exemplary conventional electronic device. As shown in FIG. 1, the conventional electronic device 100 includes a first substrate 110 formed of piezoelectric material and a second substrate 120 formed of low-resistivity material such as silicon. The first substrate 110, which may be referred to as device substrate, includes a top surface 110a on which an electronic circuit 118 is formed. In the electronic circuit 118, film bulk acoustic resonators (FBARs) 111 each configured as a bulk acoustic wave resonator are connected by wiring pads 112. The second substrate 120, which may be referred to as cap substrate, is supported by a side wall 130 formed by stacked first and second side walls 131, 132 such that a certain gap can be maintained between a bottom surface 120a of the second substrate 120 and the top surface 110a of the first substrate 110.

The top surface 110a of the first substrate 110, the bottom surface 120a of the second substrate 120, and the side wall 130 define a cavity 119 internally including the electronic circuit 118. An external electrode 140 is formed on the bottom surface 110b of the first substrate 110. The external electrode 140 includes a via 141 and an external electrode layer 142. The via 141 is formed through a through-hole 10c extending between the top surface 110a and the bottom surface 110b of the first substrate 110. The external electrode layer 142 is formed on a bottom surface of the via 141. Accordingly, the external electrode 140 is connected to a wiring pad 112.

FIG. 2 is a circuit diagram of the electronic circuit 118 of the conventional electronic device 100 shown in FIG. 1. The electronic circuit 118 includes a plurality of film bulk acoustic resonators forming a ladder-type bandpass filter. The filter includes film bulk acoustic resonators 101, 103, 105, 107 connected in series along a signal path from an input terminal to an output terminal. The filter also includes film bulk acoustic resonators 102, 104, 106 connected in parallel between the ground and each of the nodes joining the film bulk acoustic resonators 101, 103, 105, 107.

FIG. 3 is a circuit diagram illustrating an equivalent circuit of the conventional electronic device 100 shown in FIG. 1. A bandpass filter 151 shown in the equivalent circuit corresponds to the electronic circuit 118 of FIG. 2. The conventional electronic device 100 may sometimes allow a radio frequency (RF) signal emitted by the electronic circuit 118 to be coupled to the second substrate 120 as cap substrate through the cavity 119 or the side wall 130. Such coupling may create a path bypassing the bandpass filter 151 to connect an input-side line to an output-side line of the electronic circuit 118. This path may be equivalently represented by a first capacitor 152 coupling the input-side line of the electronic circuit 118 to the second substrate 120, a resistor 153 of the second substrate 120, and a second capacitor 154 coupling the second substrate 120 to the output-side line of the electronic circuit 118.

Various aspects of electronic filters are described in "Development of FBAR Filters: In Comparison with SAW Filters," Transactions of Institute of Electronics, Information and Communication Engineers, Electronic Device, 103 (728), 9-14, 2004 Mar. 9.

SUMMARY

Embodiments of the present invention relate to an electronic device in which a bulk acoustic wave (BAW) resonator is used and a method of manufacturing the electronic device.

As illustrated in the equivalent circuit of FIG. 3, the conventional electronic device 100 may allow an RF signal emitted by the electronic circuit 118 to be coupled to the second substrate 120 as the cap substrate. This may cause the frequency characteristics of the electronic device 100 to be degraded. Specifically, the pass loss of the bandpass filter may increase in the electronic device 100.

Various aspects of the present disclosure are proposed in view of the above described circumstances, and improve the frequency characteristics of the electronic device 100 by preventing the RF signal emitted by the electronic circuit 118 formed on the top surface 110a of the first substrate 110 as the device substrate from being coupled to the second substrate 120 as the cap substrate in the electronic device 100.

To address one or more of the problems described above, an electronic device according to aspects of the present invention may include a first substrate formed of piezoelectric material, the first substrate having an electronic circuit including a bulk acoustic wave (BAW) resonator on a top surface, a second substrate having a bottom surface disposed opposing the top surface of the first substrate, the second substrate being formed of low-resistivity material, and a side wall supporting the top surface of the first substrate and the bottom surface of the second substrate therebetween to be spaced by a certain gap, the side wall defining a cavity together with the top surface of the first substrate and the bottom surface of the second substrate, the cavity internally including the electronic circuit, a thin film of high-resistivity material being formed on at least a portion of the bottom surface of the second substrate to prevent a radio frequency (RF) signal emitted by the electronic circuit from being coupled to the second substrate. The low-resistivity material forming the second substrate may include silicon and the high-resistivity material forming the thin film may include at least one of silicon dioxide ($SiO_2$) and aluminum oxide ($Al_2O_3$).

Further, the electronic device according to aspects of the present invention may include a first substrate formed of piezoelectric material, the first substrate having an electronic circuit including a bulk acoustic wave (BAW) resonator on an top surface, a second substrate having a bottom surface disposed opposing the top surface of the first substrate, and a side wall supporting the top surface of the first substrate and the bottom surface of the second substrate therebetween to be spaced by a certain gap, the side wall defining a cavity together with the top surface of the first substrate and the bottom surface of the second substrate, the cavity internally including the electronic circuit, the second substrate being formed of high-resistivity material to prevent an RF signal emitted by the electronic circuit from being coupled to the second substrate. The high-resistivity material forming the second substrate may include at least one of silicon dioxide ($SiO_2$) and aluminum oxide ($Al_2O_3$).

The piezoelectric material forming the first substrate may include at least one of aluminum nitride (AlN) and zinc oxide (ZnO). The bulk acoustic wave resonator may include at least one of a film bulk acoustic resonator (FBAR) and a solidly mounted resonator (SMR).

The side wall may be formed of metal and may be connected to the second substrate via a thin film. The side wall may be formed by transient liquid phase bonding. A ground line of the electronic circuit may be connected to the side wall.

The electronic device may further include a column extending between the top surface of the first substrate and the bottom surface of the second substrate to support the first substrate and the second substrate. The column may be formed of metal and connected to the second substrate via a thin film. The first substrate may include a through-hole extending between the top surface and the bottom surface and also include a via formed in the through-hole. The via may connect the electronic circuit to an external electrode formed on the bottom surface. The column may be formed immediately above the via.

The piezoelectric material forming the first substrate may include at least one of aluminum nitride (AlN) and zinc oxide (ZnO). The bulk acoustic wave resonator may include at least one of an FBAR and a SMR.

A duplexer according to aspects of the present invention may include a reception filter configured to allow a first frequency to pass through and a transmission filter configured to allow a second frequency to pass through, at least one of the reception and transmission filters including the electronic device. A diplexer according aspects of to the present invention may include a first reception filter configured to receive a signal of a first frequency band and a second reception filter configured to receive a signal of a second frequency band different from the first frequency band, at least one of the first and second reception filters including the electronic device. A communication device according aspects of to the present invention may include at least one of the duplexer and the diplexer. The communication device may be a mobile phone.

A method of manufacturing an electronic device according to an aspect of the present invention may include forming an electronic circuit on a top surface of a first substrate formed of piezoelectric material, the electronic circuit including a bulk acoustic wave (BAW) resonator, forming a thin film on at least a portion of a bottom surface of a second substrate formed of low-resistivity material, and forming a side wall between the top surface of the first substrate and the bottom surface of the second substrate such that a cavity internally including an electronic circuit can be defined by the top surface of the first substrate, the bottom surface of the second substrate, and the side wall, the thin film being formed of high-resistivity material to prevent a radio frequency (RF) signal of the electronic circuit from being coupled to the second substrate. The low-resistivity material forming the second substrate may include silicon and the high-resistivity material forming the thin film may include at least one of silicon dioxide ($SiO_2$) and aluminum oxide ($Al_2O_3$).

Still further, a method of manufacturing an electronic device according aspects of to the present invention may include forming an electronic circuit including a bulk acoustic wave (BAW) resonator on a top surface of a first substrate formed of piezoelectric material, preparing a second substrate, and forming a side wall between the top surface of the first substrate and the bottom surface of the second substrate such that a certain gap can be maintained between the bottom surface of the second substrate and the top surface of the first substrate to define a cavity internally including the electronic circuit by the top surface of the first substrate, the bottom surface of the second substrate, and the side wall, the second substrate being formed of high-resistivity material to prevent a radio frequency (RF) signal of the electronic circuit from being coupled to the second substrate. The high-resistivity material forming the second substrate may include at least one of silicon dioxide ($SiO_2$) and aluminum oxide ($Al_2O_3$).

Embodiments of present invention may prevent an RF signal emitted by the electronic circuit formed on a top surface of a first substrate as a device substrate of an electronic device from being coupled to a second substrate as a cap substrate thereof, and therefore the frequency characteristics of the electronic device may be improved.

DETAILED DESCRIPTION

Figure 4:
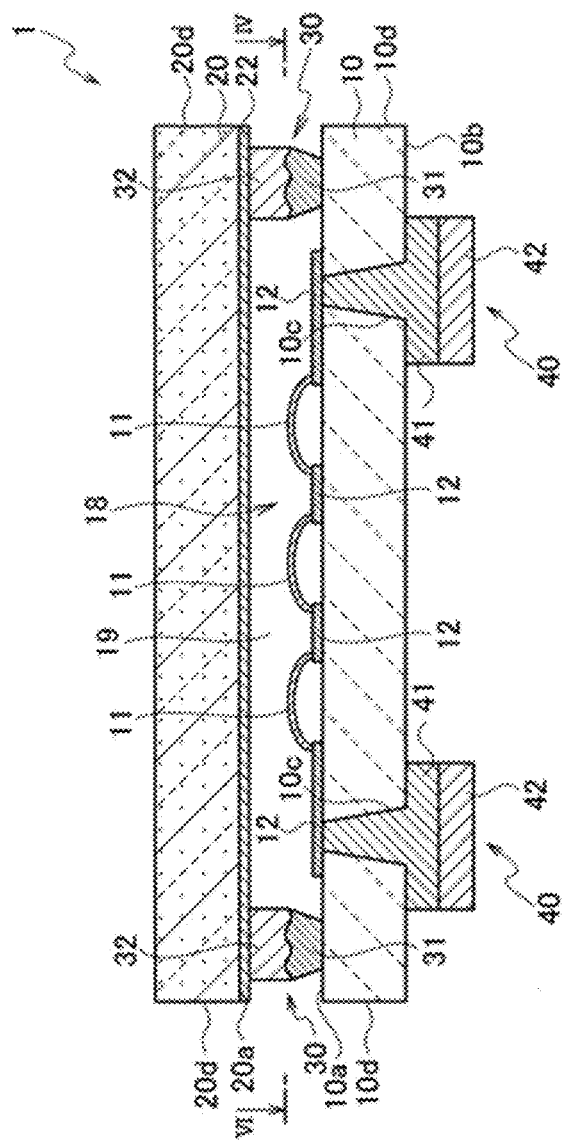
FIG. 4 is a cross-sectional view schematically showing a configuration of an electronic device according to a first example.
Figure 5A:
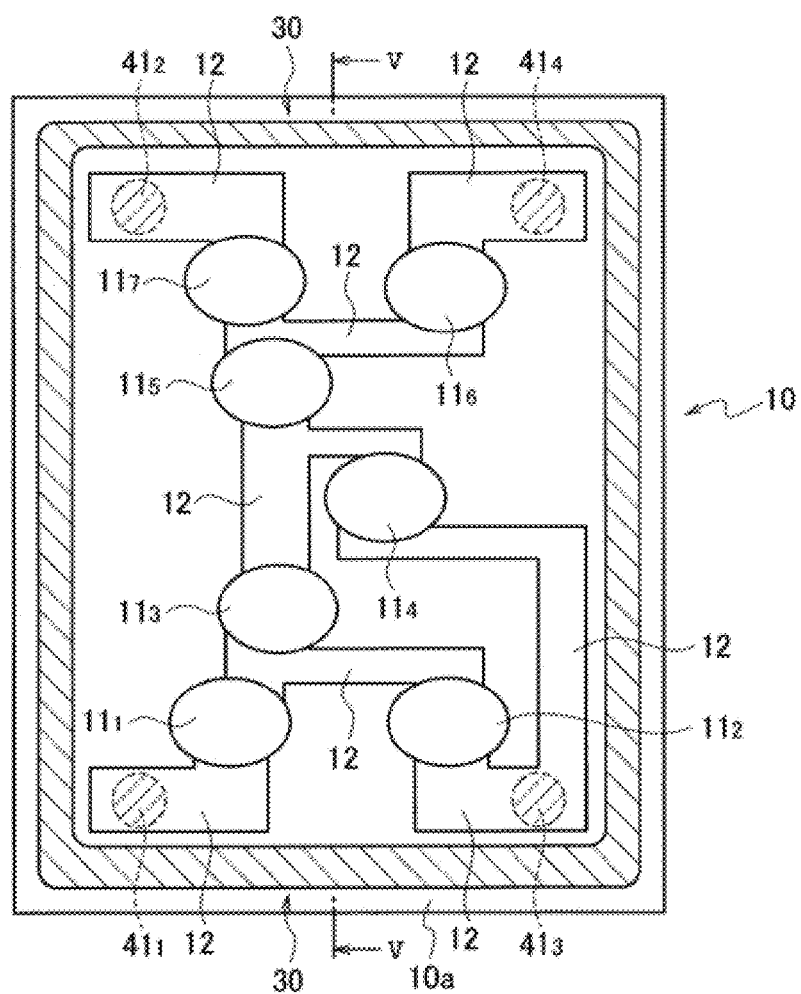
FIG. 5A is another cross-sectional view illustrating an electronic circuit arrangement of the electronic device of FIG. 4.
Figure 5B:
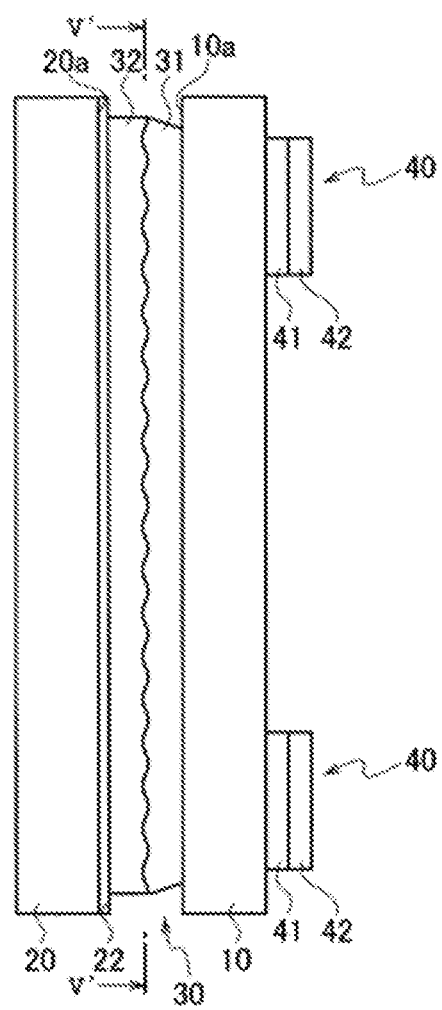
FIG. 5B is a side view of the electronic device of FIG. 4.

An electronic device and a method of manufacturing the same device according to aspects of the present invention will be described below in detail with reference to the drawings. A first example is directed to a configuration in which a thin film of high-resistivity is formed on a bottom surface of a cap substrate. FIG. 4 is a cross-sectional view schematically showing a configuration of an electronic device according to the first example. FIG. 5A is a plan view illustrating an electronic circuit arrangement of the electronic device according to the first example. FIG. 5B is a side view of the electronic device according to the first example. Here, the cross-sectional view of FIG. 4 is taken along line V-V of FIG. 5A. Further, the plan view of FIG. 5A is taken along line IV-IV of FIG. 4 and also line V'-V' of FIG. 5B.

As shown in FIGS. 4, 5A and 5B, an electronic device according to the first example includes a first substrate 10 having a certain thickness and a second substrate 20 having a certain thickness and opposing the first substrate 10 with a certain gap. The first substrate 10 may be referred to as a device substrate and has a top surface 10a opposing the second substrate 20. On the top surface 10a, an electronic circuit 18 including a film bulk acoustic resonator (FBAR) 11 is formed. The second substrate 20 may be referred to as a cap substrate and has a bottom surface 20a supported by a side wall 30 to maintain a certain gap from the top surface 10a of the first substrate 10. The top surface 10a of the first substrate 10, the bottom surface 20a of the second substrate 20, and the side wall 30 define a cavity 19 internally including the electronic circuit 18 formed on the top surface 10a of the first substrate 10.

The first substrate 10 may be formed of a piezoelectric material including, for example, aluminum nitride (AlN) or zinc oxide (ZnO). On the top surface 10a of the first substrate 10, a plurality of film bulk acoustic resonators 11 are formed by a thin film of piezoelectric material. The film bulk acoustic resonators 11 are connected to each other by wiring pads 12 to form an electronic circuit 18 such as a filter or a filter device. It is to be appreciated that, although the electronic circuit 18 is described to include the film bulk acoustic resonators 11, according to aspects of the present invention, surface acoustic wave (SAW) elements or bulk acoustic wave (BAW) elements such as solidly mounted resonators (SMRs) can be used in addition to or instead of the film bulk acoustic resonators 11.

An external electrode 40 is formed on the bottom surface 10b of the first substrate 10. The external electrode 40 is formed by a via 41 and an external electrode layer 42. The via 41 is formed through a through-hole 10c extending between the top surface 10a and the bottom surface 10b of the first substrate 10. The external electrode layer 42 is formed on a bottom surface of the via 41. The via 41 is formed by copper plating and the external electrode layer 42 is formed by solder plating. The via 41 is connected to a wiring pad 12 of the electronic circuit 18 formed on the top surface 10a of the first substrate 10.

Figure 2:
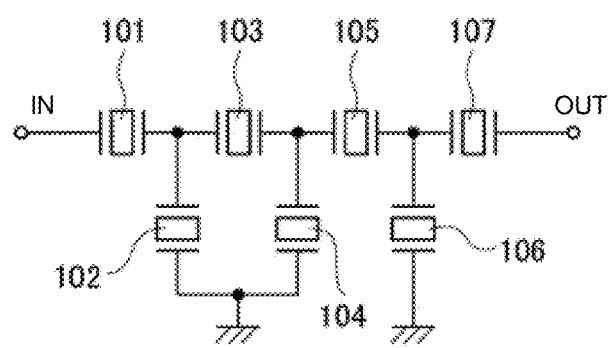
FIG. 2 is a circuit diagram of the conventional electronic device shown in FIG. 1.

As shown in FIG. 5A, the film bulk acoustic resonators $11_1$-$11_7$ are appropriately connected by wiring pads 12 such that a bandpass filter configured similarly to the circuit diagram of FIG. 2 is formed on the top surface 10a of the first substrate 10. In particular, the film bulk acoustic resonators $11_1$, $11_3$, $11_5$, $11_7$ are connected in series along a signal path extending between the via $41_1$ as an input electrode and the via $41_2$ as an output electrode. Further, the film bulk acoustic resonators $11_2$, $11_4$, $11_6$ are connected in parallel between the via $41_3$, $41_4$ as ground and respective nodes joining the film bulk acoustic resonators $11_1$, $11_3$, $11_5$, $11_7$. Thus, the respective nodes joining the film bulk acoustic resonators $11_1$, $11_3$, $11_5$ are connected to the via $41_3$ as ground through the film bulk acoustic resonators $11_2$, $11_4$ respectively. The respective nodes joining the film bulk acoustic resonators $11_5$, $11_7$ are connected to the via $41_4$ as ground through the film bulk acoustic resonator $11_6$. Here, the film bulk acoustic resonators 11 of FIG. 4 are schematically shown as an exemplary arrangement of the film bulk acoustic resonators $11_1$-$11_7$ of FIG. 5A. Further, the external electrode 40, the via 41 and the like of FIGS. 4 and 5B are schematically shown as an exemplary arrangement of the vias $41_1$-$41_4$ of FIG. 5A.

The second substrate 20 is formed of a low-resistivity material such as a semiconductor material. The second substrate 20 may be formed of silicon, for example. A thin film 22 made of high-resistivity material such as a dielectric is formed on the bottom surface 20a of the second substrate 20. The thin film 22 may be formed of silicon dioxide ($SiO_2$) or aluminum oxide ($Al_2O_3$), for example. The second substrate 20 is supported by the side wall 30 via the thin film 22.

The first substrate 10 and the second substrate 20 are supported by the side wall 30 and separated to have a certain gap between the top surface 10a of the first substrate 10 and the bottom surface 20a of the second substrate 20. The side wall 30 extends along a periphery 10d of the first substrate 10 and a periphery 20d of the second substrate 20 to surround the electronic circuit 18 formed on the top surface 10a of the first substrate 10. The top surface 10a of the first substrate 10, the bottom surface 20a of the second substrate 20, and the side wall 30 define a cavity 19 internally including the electronic circuit 18. The side wall 30 is formed by a first side wall 31 and a second side wall 32 sequentially stacked between the top surface 10a of the first substrate 10 and the thin film 22 formed on the bottom surface 20a of the second substrate 20 and bonded with each other using a transient liquid phase (TLP) bonding such that the first side wall 31 is formed of gold-tin (Au—Sn) alloy and the second side wall 32 is formed of tin-copper (Sn—Cu) alloy.

According to the first example, the thin film 22 made of high-resistivity material is formed on the bottom surface 20a of the second substrate 20 made of low-resistivity material. The thin film 22 can prevent an RF signal emitted by the electronic circuit 18 from being coupled to the second substrate 20 through the side wall 30 or a space of the cavity 19. The thin film 22 is formed of high-resistivity material such as a dielectric to have a certain thickness, such that the RF signal emitted from the electronic circuit 18 can be blocked. The thin film 22 on the bottom surface 20a of the second substrate 20 may be formed to cover certain regions including portions immediately above the side wall 30 and the electronic circuit 18. Further, the thin film 22 may be formed to entirely cover the bottom surface 20a of the second substrate 20.

The electronic device 1 of the first example may be manufactured by a series of steps described below. An electronic circuit 18 is formed to include film bulk acoustic resonators (FBARs) 11 on a top surface 10a of a first substrate 10 made of piezoelectric material and having a certain thickness. The first substrate 10 may be formed of aluminum nitride (AlN) or zinc oxide (ZnO). On the top surface 10a of the first substrate 10, the film bulk acoustic resonators 11 are appropriately connected by wiring pads 12 to configure the electronic circuit 18 such as a filter and a filter device. It is to be appreciated that, although the electronic circuit 18 includes film bulk acoustic resonators 11, according aspects of the present invention, a surface acoustic wave (SAW) element or a bulk acoustic wave (BAW) element such as a solidly mounted resonator (SMR) can be used in addition to or instead of the film bulk acoustic resonators 11.

Concurrently with, after or before forming the electronic circuit 18 on the top surface 10a of the first substrate 10, a first side wall 31 is formed to have a certain width and height and surround the electronic circuit 18 along a periphery 10d of the first substrate 10. The first side wall 31 may be formed of tin (Sn) or indium (In), for example. Further, a through-hole 10c is formed to extend between the top surface 10a and the bottom surface 10b of the first substrate. Still further, a via 41 is formed by copper plating to connect to the wiring pad 12 of the electronic circuit 18 through the through-hole 10c, and an external electrode layer 42 is formed by solder plating on a bottom surface of the via 41, such that an external electrode 40 can be formed by the via 41 and the external electrode layer 42.

A thin film 22 made of high-resistivity material is formed to have a certain thickness on a bottom surface 20a of the second substrate 20 made of low-resistivity material and having a certain thickness. The second substrate 20 may be formed of a semiconductor such as silicon. The thin film 22 may be formed of a dielectric such as silicon dioxide ($SiO_2$) or aluminum oxide ($Al_2O_3$). The thin film 22 on the bottom surface 20a of the second substrate 20 may be formed to cover certain regions including portions immediately above the side wall 30 and the electronic circuit 18. Further, the thin film 22 may be formed to entirely cover the bottom surface 20a of the second substrate 20.

After the thin film 22 is formed on the bottom surface 20a of the second substrate 20, a second side wall 32 is formed to have a certain width and height and surround the electronic circuit 18 along a periphery 20d of the second substrate 20 in a location where the first side wall 31 is formed on the top surface 10a of the first substrate 10. The second side wall 32 may be formed by sequentially stacking copper (Cu) and gold (Au), for example.

The top surface 10a of the first substrate 10 is positioned to oppose the bottom surface 20a of the second substrate 20, and a top surface of the first side wall 31 formed on the top surface 10a of the first substrate 10 is aligned with a bottom surface of the second side wall 32 formed on the bottom surface 20a of the second substrate 20. Next, the stacked side walls 31, 32 are bonded by transient liquid phase (TLP) bonding at a certain temperature over a certain time. The transient liquid phase bonding allows the first side wall 31 to be gold-tin or gold-indium alloy, for example, and the second side wall 32 to be gold-copper alloy, for example, such that the first side wall 31 and the second side wall 32 are integrally formed into the side wall 30. The side wall 30 supports the first substrate 10 and the second substrate 20 and maintains the top surface 10a of the first substrate 10 and the bottom surface 20a of the second substrate 20 to be separated by a certain gap, and therefore defines a cavity 19 together with the top surface 10a of the first substrate 10 and the bottom surface 20a of the second substrate 20 such that the electronic circuit 18 is internally included in the cavity 19.

Figure 6:
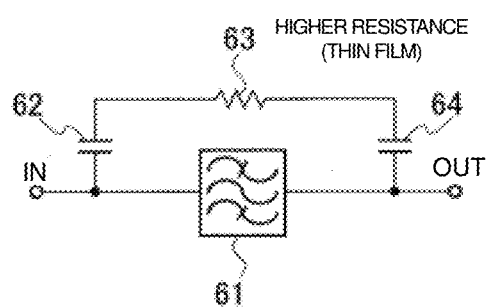
FIG. 6 shows an equivalent circuit of the electronic device of FIG. 4.

FIG. 6 is a circuit diagram showing an equivalent circuit of the electronic device 1 according to the first example. In the equivalent circuit, a bandpass filter 61 corresponds to the bandpass filter configured by the electronic circuit 18 of the first example. The bandpass filter has a configuration similar to that of the ladder-type filter shown in FIG. 2. Also in the first example, an RF signal emitted by an electronic circuit 18 can be coupled to the second substrate 20 as cap substrate through the side wall 30 or a space of the cavity 19, such that a path can be created to bypass the bandpass filter 61 between an input-side line and an output-side line of the electronic circuit 18. In the figure, the path is equivalently shown by a first capacitor 62 coupling the input-side line of the electronic circuit 18 to the second substrate 20, a resistor 63 created by the thin film 22, and a second capacitor 64 coupling the second substrate 20 to the output-side line of the electronic circuit 18.

Figure 3:
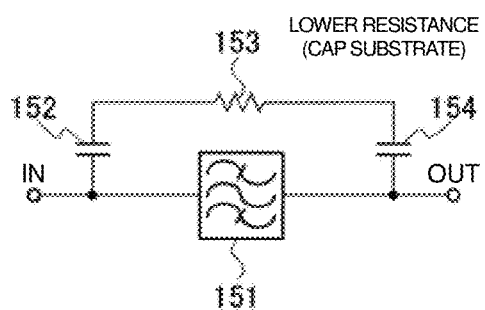
FIG. 3 shows an equivalent circuit of the conventional electronic device shown in FIG. 1.

According to the first example, the resistor 63 of the equivalent circuit may have a higher resistance similar to the thin film 22 formed of high-resistivity material, which may be a higher resistance than the resistor 153 in the equivalent circuit illustrated in FIG. 3. Further, the first capacitor 62 and the second capacitor 64 have lower capacitance than the corresponding capacitors 152 and 154 in the equivalent circuit illustrated in FIG. 3. A current bypassing the bandpass filter 61 and passing through the resistor 63 having a higher resistance and the first and second capacitors 62, 64 having a lower capacitance may be less and a contribution of such a bypassing path to the bandpass filter 61 would be suppressed to be smaller than that of a bypassing path to the bandpass filter 151 in the equivalent circuit illustrated in FIG. 3. Therefore, according to the first example, an RF signal emitted by the electronic circuit 18 can be prevented from being coupled to the second substrate 20 as the cap substrate, such that the frequency characteristics of the electronic device 1 can be improved. Specifically, for example, pass loss of the bandpass filter 61 may be reduced as compared to a similar electronic device not including the high resistance substrate 20 and/or the high resistance thin film 22.

Figure 7:
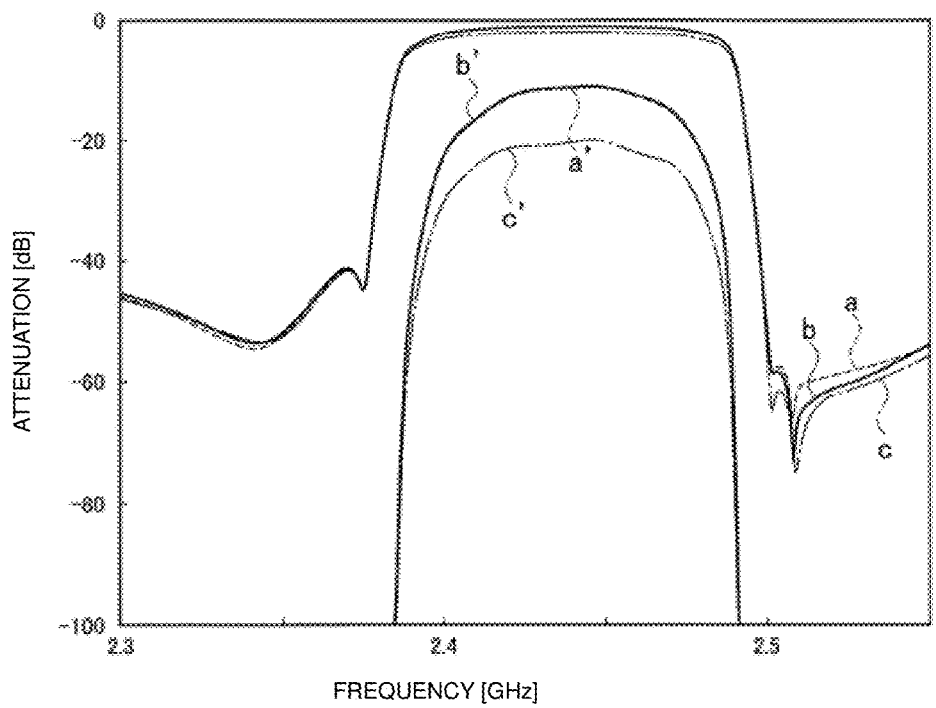
FIG. 7 is a graph showing frequency characteristics of the electronic device of FIG. 4.

FIG. 7 is a graph showing frequency characteristics of the electronic device of the first example that are estimated by a simulation. In the graph, the horizontal axis represents frequency, while the vertical axis represents attenuation level. Also in the graph, curve a indicates the case where the thin film 22 is formed of silicon dioxide ($SiO_2$), while curve b indicates the case where the thin film 22 is formed of aluminum oxide ($Al_2O_3$). Curve c indicates the case where the thin film 22 does not exist for comparison. Curves a', b' and c' correspond respectively to curves a, b and c reduced in the scale of attenuation level by a factor of 10 to be shown in the same graph. As can be seen in FIG. 7, the graph of the curves a, b, and c, and the curves a' and b' are nearly identical to one another at certain frequencies.

As shown in the graph, curves a, a' corresponding to the thin film 22 of silicon dioxide, and curves b, b' corresponding to the thin film 22 of aluminum oxide indicate that the attenuation levels are lower (i.e., the attenuation in the passband is less) than those of curves c, c' corresponding to no thin film 22, and the attenuation occurring outside the passband is maintained without degradation. Therefore, it can be seen that the loss occurring inside the passband can be reduced or lessened and the attenuation occurring outside the passband can be ensured or maintained in the electronic device 1 in which the thin film 22 of high-resistivity material including dielectric such as silicon dioxide, aluminum oxide and the like is formed on the bottom surface 20a of the second substrate 20 according to the first example.

Figure 8:
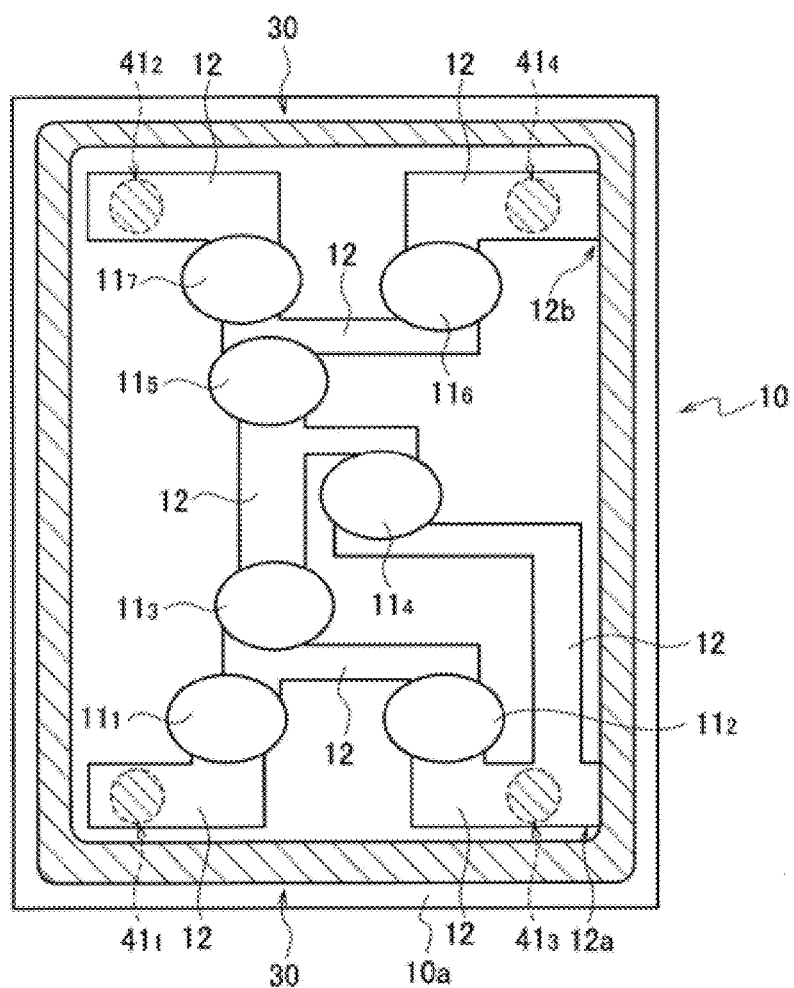
FIG. 8 is another cross-sectional view illustrating an alternative electronic circuit arrangement of the electronic device according to the first example.

FIG. 8 is another cross-sectional view illustrating an alternative electronic circuit arrangement of the electronic device according to the first example. The arrangement of the alternative electronic circuit is different from that of FIG. 5A in that the wiring pads 12 connecting the vias $41_3$, $41_4$ as ground to respective nodes joining the film bulk acoustic resonators $11_1$, $11_3$, $11_5$, $11_7$ through the film bulk acoustic resonators $11_2$, $11_4$, $11_6$ extend beyond the vias $41_3$, $41_4$ as ground and are connected to the side wall 30.

In particular, the film bulk acoustic resonators $11_1$, $11_3$, $11_5$, $11_7$ are connected in series along a signal path extending between the via $41_1$ corresponding to the input electrode and the via $41_2$ corresponding to the output electrode. Further, the film bulk acoustic resonators $11_2$, $11_4$, $11_6$ are connected in parallel between the vias $41_3$, $41_4$ as ground and respective nodes joining the film bulk acoustic resonators $11_1$, $11_3$, $11_5$, $11_7$. The side wall 30 is connected at connections 12a to the wiring pads 12 that connect the vias $41_3$, $41_4$ as ground to respective nodes joining the film bulk acoustic resonators $11_1$, $11_3$, $11_5$, $11_7$ through the film bulk acoustic resonators $11_2$, $11_4$, $11_6$ and extend beyond the vias $41_3$, $41_4$ as ground. Thus, the respective nodes joining the film bulk acoustic resonators $11_1$, $11_3$, $11_5$ are connected to the via $41_3$ as ground through the film bulk acoustic resonators $11_2$, $11_4$ and extend beyond the via $41_3$ to reach the side wall 30. The node joining the film bulk acoustic resonators $11_5$, $11_7$ is connected to the via $41_4$ as ground through the film bulk acoustic resonator $11_6$ and extends beyond the via $41_4$ to reach the side wall 30 at the connection 12b.

According to this alternative example, the side wall 30 is connected to the vias $41_3$, $41_4$ as ground and maintained at ground potential. Therefore, an RF signal emitted by the electronic circuit 18 surrounded by the side wall 30 can be blocked from being coupled to the second substrate 20 through the side wall 30, such that the loss occurring inside the passband of the electronic device 1 can be reduced or lessened and the attenuation occurring outside the passband can be ensured. It is to be appreciated that, although the side wall 30 is described to be connected to each of the vias $41_3$, $41_4$ as ground according to the alternative example, the side wall 30 may be connected to either one of the vias $41_3$, $41_4$. Even in this case, the side wall 30 can be maintained at ground potential such that an effect can be achieved similar to the case where the respective vias $41_3$, $41_4$ are connected to the side wall 30.

Figure 9:
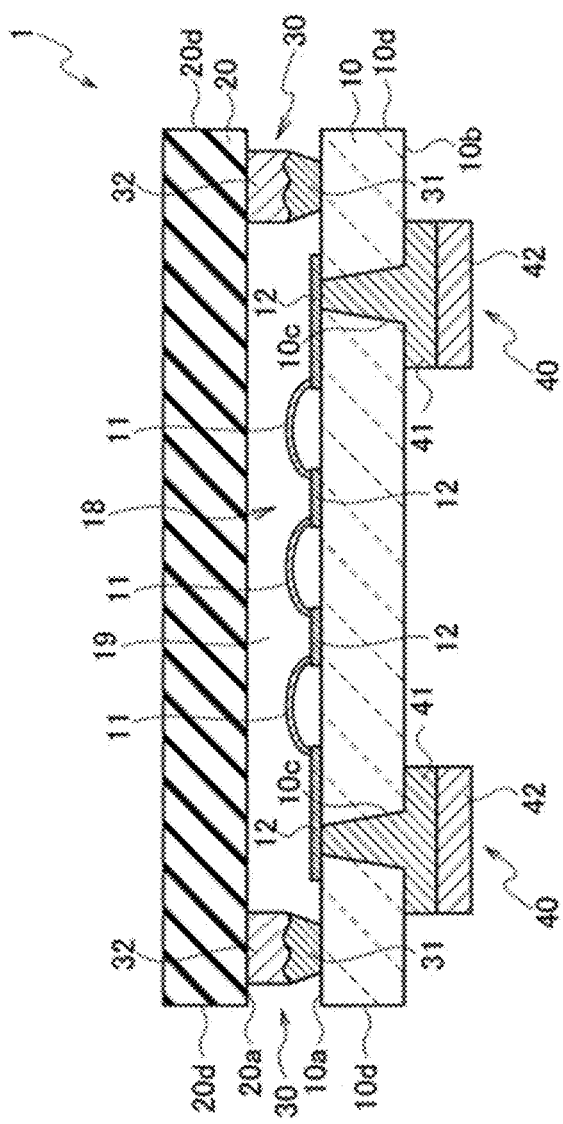
FIG. 9 is a cross-sectional view schematically showing a configuration of the electronic device according to a second example.

A second example is directed to a configuration in which a cap substrate is formed of high-resistivity material. FIG. 9 is a cross-sectional view schematically showing a configuration of the electronic device according to the second example. The second example is different from the first example in that the second substrate 20 as a cap substrate is formed of high-resistivity material and the thin film 22 formed on the bottom surface 20a of the second substrate 20 does not exist. The other configurations are similar to those of the first example. In FIG. 9, components common with the first example are indicated by like reference symbols in order to clarify the correspondence relationship with the first example. The description below directed to the second example still refers to FIG. 5A for the other cross-sectional view illustrating the electronic circuit arrangement of the electronic device according to the first example and FIG. 5B for the side view illustrating the electronic device of the first example due to the commonality between the first and second examples.

As shown in FIGS. 9, 5A and 5B, the electronic device 1 of the second example includes a first substrate 10 having a certain thickness and a second substrate 20 having a certain thickness and opposing the first substrate 10 with a certain gap. The first substrate 10 may be referred to as a device substrate and has a top surface 10a opposing the second substrate 20. On the top surface 10a, an electronic circuit 18 including a film bulk acoustic resonator (FBAR) 11 is formed. The second substrate 20 may be referred to as a cap substrate and has a bottom surface 20a supported by a side wall 30 to maintain a certain gap from the top surface 10a of the first substrate 10. The top surface 10a of the first substrate 10, the bottom surface 20a of the second substrate 20, and the side wall 30 define a cavity 19 internally including the electronic circuit 18 formed on the top surface 10a of the first substrate 10.

The first substrate 10 may be formed of piezoelectric material including aluminum nitride (AlN) or zinc oxide (ZnO), for example. On the top surface 10a of the first substrate 10, a plurality of film bulk acoustic resonators 11 are formed by a thin film of piezoelectric material. The film bulk acoustic resonators 11 are connected to each other by wiring pads 12 to form an electronic circuit 18 such as a filter or a filter device. It is to be appreciated that, although the electronic circuit 18 is described to include the film bulk acoustic resonators 11, according to aspects of the present invention, surface acoustic wave (SAW) elements or bulk acoustic wave (BAW) elements such as solidly mounted resonators (SMRs) can be used in addition to or instead of the film bulk acoustic resonators 11.

An external electrode 40 is formed on the bottom surface 10b of the first substrate 10. The external electrode 40 is formed by a via 41 and an external electrode layer 42. The via 41 is formed through a through-hole 10c extending between the top surface 10a and the bottom surface 10b of the first substrate 10. The external electrode layer 42 is formed on a bottom surface of the via 41. The via 41 is formed by copper plating and the external electrode layer 42 is formed by solder plating. The via 41 is connected to a wiring pad 12 of the electronic circuit 18 formed on the top surface 10a of the first substrate 10.

As shown in FIG. 5A, the film bulk acoustic resonators $11_1$-$11_7$ are appropriately connected by wiring pads 12 such that a bandpass filter configured similarly to the circuit diagram of FIG. 2 is formed on the top surface 10a of the first substrate 10. In particular, the film bulk acoustic resonators $11_1$, $11_3$, $11_5$, $11_7$ are connected in series along a signal path extending between the via $41_1$ as an input electrode and the via $41_2$ as an output electrode. Further, the film bulk acoustic resonators $11_2$, $11_4$, $11_6$ are connected in parallel between the via $41_3$, $41_4$ as ground and respective nodes joining the film bulk acoustic resonators $11_1$, $11_3$, $11_5$, $11_7$. Thus, the respective nodes joining the film bulk acoustic resonators $11_1$, $11_3$, $11_5$ are connected to the via $41_3$ as ground through the film bulk acoustic resonators $11_2$, $11_4$ and, as illustrated in FIG. 8, may extend beyond the via $41_3$ to reach the side wall 30. Respective nodes joining the film bulk acoustic resonators $11_5$, $11_7$ are connected to the via $41_4$ as ground through the film bulk acoustic resonator $11_6$. Here, the film bulk acoustic resonators 11 of FIG. 9 are schematically shown as an exemplary arrangement of the film bulk acoustic resonators $11_1$-$11_7$ of FIG. 5A. Further, the external electrode 40, the via 41 and the like of FIGS. 9 and 5B are schematically shown as an exemplary arrangement of the vias $41_1$-$41_4$ of FIG. 5A. It is to be appreciated that, also according to the second example, at least one of the vias $41_3$, $41_4$ as ground may be connected to the side wall 30 similarly to the alternative example of the first example shown in FIG. 8.

The second substrate 20 is formed of high-resistivity material such as a dielectric. The second substrate 20 may be formed of silicon dioxide ($SiO_2$) or aluminum oxide ($Al_2O_3$), for example.

The first substrate 10 and the second substrate 20 are supported by the side wall 30 and separated to have a certain gap between the top surface 10a of the first substrate 10 and the bottom surface 20a of the second substrate 20. The side wall 30 extends along a periphery 10d of the first substrate 10 and a periphery 20d of the second substrate 20 to surround the electronic circuit 18 formed on the top surface 10a of the first substrate 10. The top surface 10a of the first substrate 10, the bottom surface 20a of the second substrate 20, and the side wall 30 define a cavity 19 internally including the electronic circuit 18. The side wall 30 is formed by a first side wall 31 and a second side wall 32 sequentially stacked between the top surface 10a of the first substrate 10 and the bottom surface 20a of the second substrate 20 and bonded with each other using a transient liquid phase (TLP) bonding such that the first side wall 31 is formed of gold-tin (Au—Sn) alloy and the second side wall 32 is formed of tin-copper (Sn—Cu) alloy.

According to the second example, the second substrate 20 is formed of a high-resistivity material. The high resistivity material forming the second substrate 20 can prevent an RF signal emitted by the electronic circuit 18 from being coupled to the second substrate 20 through the side wall 30 or a space of the cavity 19 such that the RF signal is blocked from flowing into the second substrate 20. The second substrate 20 is formed of a high-resistivity material such as dielectric such that a path of an RF signal emitted from the electronic circuit 18 passing through the second substrate 20 cannot be created.

The electronic device 1 of the second example may be manufactured by a series of steps described below. An electronic circuit 18 is formed to include film bulk acoustic resonators (FBARs) 11 on a top surface 10a of a first substrate 10 made of piezoelectric material and having a certain thickness. The first substrate 10 may be formed of aluminum nitride (AlN) or zinc oxide (ZnO). On the top surface 10a of the first substrate 10, the film bulk acoustic resonators 11 are appropriately connected by wiring pads 12 to configure the electronic circuit 18 such as a filter and a filter device. It is to be appreciated that, although the electronic circuit 18 in described to include the film bulk acoustic resonators 11, according to aspects of the present invention, surface acoustic wave (SAW) elements or bulk acoustic wave (BAW) elements such as solidly mounted resonators (SMRs) can be used in addition to or instead of the film bulk acoustic resonators 11.

Concurrently with, after or before forming the electronic circuit 18 on the top surface 10a of the first substrate 10, a first side wall 31 is formed to have a certain width and height and surround the electronic circuit 18 along a periphery 10d of the first substrate 10. The first side wall 31 may be formed of tin (Sn) or indium (In), for example. Further, a through-hole 10c is formed to extend between the top surface 10a and the bottom surface 10b of the first substrate. Still further, a via 41 is formed by copper plating to connect to the wiring pad 12 of the electronic circuit 18 through the through-hole 10c, and an external electrode layer 42 is formed by solder plating on a bottom surface of the via 41, such that an external electrode 40 can be formed by the via 41 and the external electrode layer 42.

A second substrate 20 formed of a high-resistivity material is provided to have a certain thickness. The second substrate 20 may be formed of silicon dioxide ($SiO_2$) or aluminum oxide ($Al_2O_3$) for example.

A second side wall 32 is formed to have a certain width and height and surround the electronic circuit 18 along a periphery 20d of the second substrate 20 in a location where the first side wall 31 is formed on the top surface 10a of the first substrate 10. The second side wall 32 may be formed by sequentially stacking copper (Cu) and gold (Au), for example.

The top surface 10a of the first substrate 10 is positioned to oppose the bottom surface 20a of the second substrate 20, and a top surface of the first side wall 31 formed on the top surface 10a of the first substrate 10 is aligned with a bottom surface of the second side wall 32 formed on the bottom surface 20a of the second substrate 20. Next, the stacked side walls 31, 32 are bonded by transient liquid phase (TLP) bonding at a certain temperature over a certain time. The transient liquid phase bonding allows the first side wall 31 to be gold-tin or gold-indium alloy, for example, and the second side wall 32 to be gold-copper alloy, for example, such that the first side wall 31 and the second side wall 32 are integrally formed into the side wall 30. The side wall 30 supports the first substrate 10 and the second substrate 20 and maintains the top surface 10a of the first substrate 10 and the bottom surface 20a of the second substrate 20 to be separated by a certain gap, and therefore defines a cavity 19 together with the top surface 10a of the first substrate 10 and the bottom surface 20a of the second substrate 20 such that the electronic circuit 18 is internally included in the cavity 19.

Figure 10:
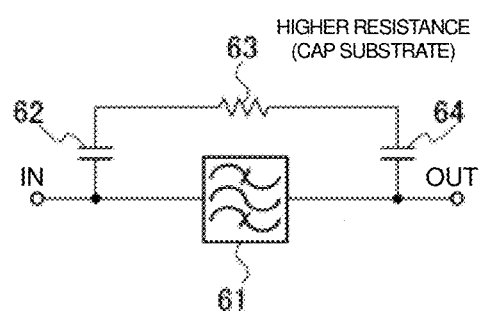
FIG. 10 shows an equivalent circuit of the electronic device of FIG. 9.

FIG. 10 is a circuit diagram showing an equivalent circuit of the electronic device 1 according to the second example. In the equivalent circuit, a bandpass filter 61 corresponds to the bandpass filter configured by the electronic circuit 18 of the second example. The bandpass filter has a configuration similar to that of the ladder-type filter shown in FIG. 2. Also in the second example, an RF signal emitted by an electronic circuit 18 can be coupled to the second substrate 20 as cap substrate through the side wall 30 or a space of the cavity 19, such that a path can be created to bypass the bandpass filter 61 between an input-side line and an output-side line of the electronic circuit 18. In the figure, the path is equivalently shown by a first capacitor 62 coupling the input-side line of the electronic circuit 18 to the second substrate 20, a resistor 63 created by the second substrate 20, and a second capacitor 64 coupling the second substrate 20 to the output-side line of the electronic circuit 18.

According to the second example, the resistor 63 of the equivalent circuit is configured to have a higher resistance corresponding to the second substrate 20 formed of high-resistivity material, for example, a higher resistance than that of the resistor 153 of the equivalent circuit illustrated in FIG. 3. Further, the first capacitor 62 and the second capacitor 64 have a lower capacitance than the corresponding capacitors 152, 154 of the equivalent circuit illustrated in FIG. 3. A current bypassing the bandpass filter 61 and passing through the resistor 63 having a higher resistance and the first and second capacitors 62, 64 having a lower capacitance may be less and a contribution of such a bypassing path to the bandpass filter 61 would be suppressed to be smaller. Therefore, according to the second example, an RF signal emitted by the electronic circuit 18 can be prevented from being coupled to the second substrate 20 as the cap substrate, such that the frequency characteristics of the electronic device 1 can be improved as compared to those of a similar electronic device having a less resistive second substrate 20. Specifically, for example, pass loss (i.e., loss in the passband) of the bandpass filter 61 may be reduced as compared to pass loss of the bandpass filter 151 of the equivalent circuit illustrated in FIG. 3.

Figure 11:
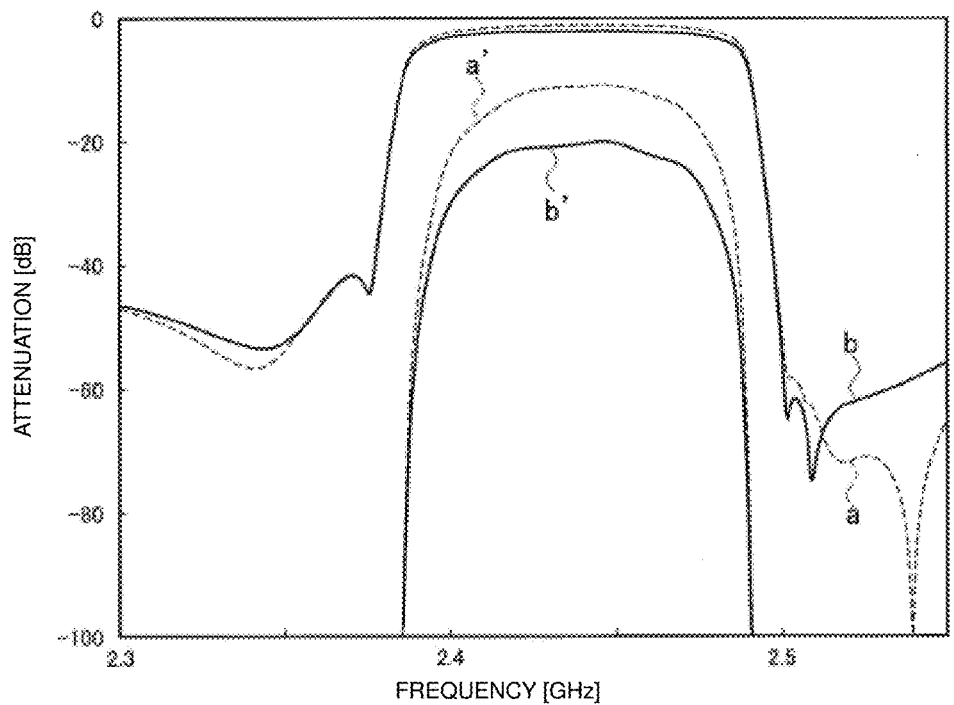
FIG. 11 is a graph showing frequency characteristics of the electronic device of FIG. 9.

FIG. 11 is a graph showing frequency characteristics of the electronic device of the second example that are estimated by a simulation. In the graph, the horizontal axis represents frequency, while the vertical axis represents attenuation level. Also in the graph, curve a indicates the case where the second substrate 20 is formed of high-resistivity material having the resistance of 5 kΩ. Curve b indicates the case where the second substrate 20 is formed of low-resistivity material having the resistance of 1Ω. Curves a' and b' correspond respectively to curves a and b reduced in the scale of attenuation level by a factor of 10 to be shown in the same graph.

As shown in the graph, curves a, a' corresponding to the second substrate 20 formed of the high-resistivity material indicate that the attenuation levels are lower than (e.g., less than) those of curves b, b' corresponding to the second substrate 20 formed of the low-resistivity material and the attenuation occurring outside the passband is maintained without degradation. Therefore, it can be seen that the loss occurring inside the passband can be reduced and the attenuation occurring outside the passband can be ensured or maintained in the electronic device 1 in which the second substrate 20 is formed of high-resistivity material including dielectric such as silicon dioxide or aluminum oxide according to the second example.

Figure 12:
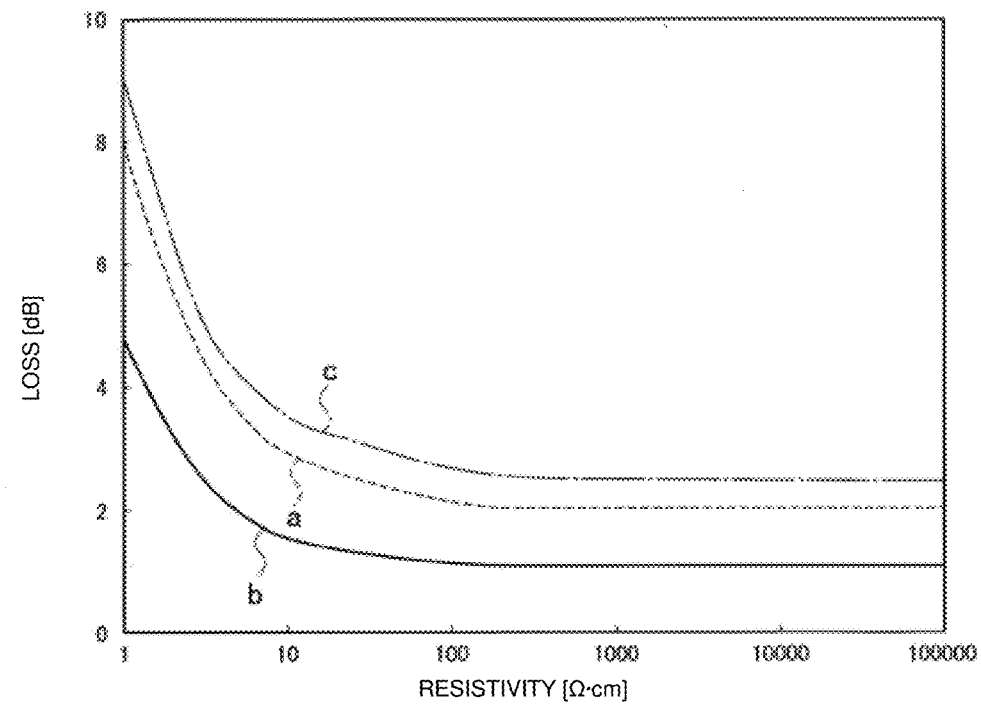
FIG. 12 is a graph showing resistivity characteristics of the electronic device of FIG. 9.

FIG. 12 is a graph showing resistivity characteristics of the electronic device of the second example that are estimated by a simulation. In the graph, the horizontal axis represents resistivity, while the vertical axis represents pass or insertion loss. Curve a indicates peak values of the passband shown in FIG. 11. Similarly, curve b indicates higher-edge values of the passband and curve c indicates lower-edge values thereof. As can be seen in any of curves a, b and c, the losses constantly decrease as the resistivity increases but level off at certain values when the resistivity exceeds a certain value. Therefore, it can be seen that the electronic device 1 in which the second substrate 20 is configured to have a resistivity greater than a certain value can allow the pass loss to be sufficiently small.

Figure 13:
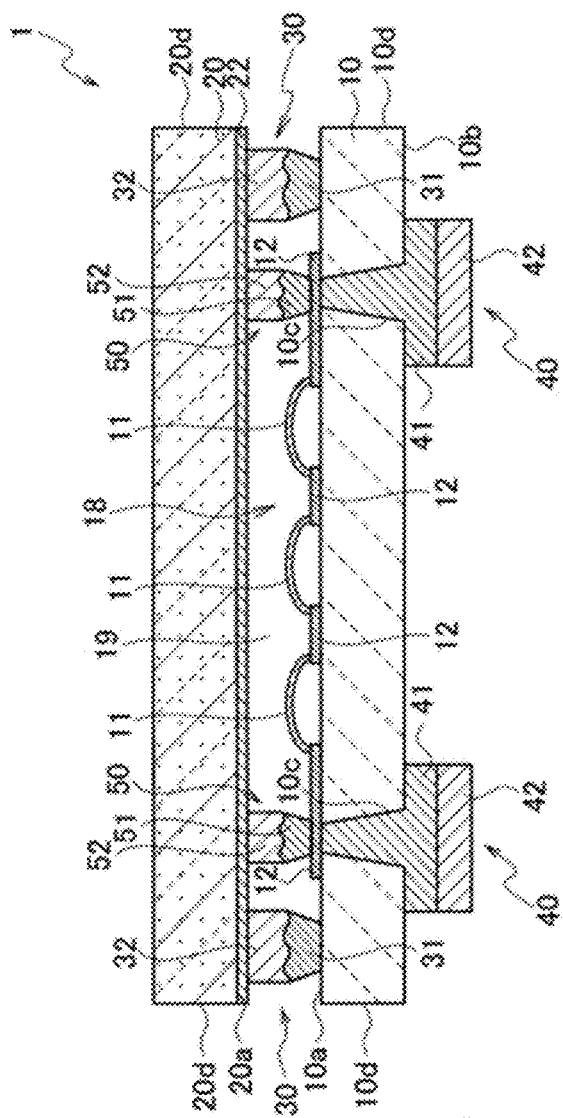
FIG. 13 is a cross-sectional view schematically showing a configuration of an electronic device according to a third example.
Figure 14:
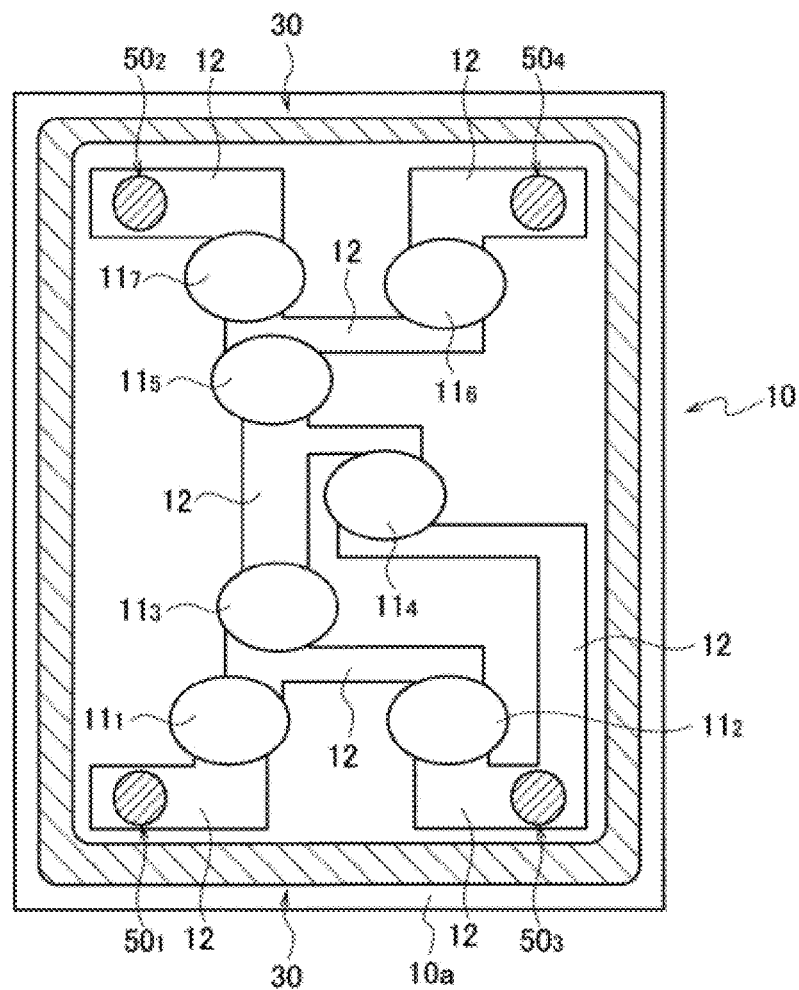
FIG. 14 is another cross-sectional view illustrating an electronic circuit arrangement of the electronic device of FIG. 13.

A third example is directed to a configuration in which a thin film of high-resistivity is formed on a bottom surface of a cap substrate and also a column is formed between the cap substrate and a device substrate. FIG. 13 is a cross-sectional view schematically showing a configuration of an electronic device according to the third example. FIG. 14 is another cross-sectional view illustrating an electronic circuit arrangement of the electronic device according to the third example. The third example is different from the first example in that the column is formed. The other configurations are similar to those of the first example. In FIGS. 13 and 14, components common with the first example are indicated by like reference symbols in order to clarify the correspondence relationship with the first example. The description below directed to the third example still refers to FIG. 5B for the side view illustrating the electronic device of the first example due to the commonality between the first and third example.

As shown in FIGS. 13, 14, and 5B, an electronic device 1 of the third example includes a first substrate 10 having a certain thickness and a second substrate 20 having a certain thickness and opposing the first substrate 10 with a certain gap. The first substrate 10 may be referred to as a device substrate and has a top surface 10a opposing the second substrate 20. On the top surface 10a, an electronic circuit 18 including a film bulk acoustic resonator (FBAR) 11 is formed. The second substrate 20 may be referred to as a cap substrate and has a bottom surface 20a supported by a side wall 30 and a column 50 to maintain a certain gap from the top surface 10a of the first substrate 10. The top surface 10a of the first substrate 10, the bottom surface 20a of the second substrate 20, and the side wall 30 define a cavity 19 internally including the electronic circuit 18 formed on the top surface 10a of the first substrate 10.

The first substrate 10 may be formed of piezoelectric material including aluminum nitride (AlN) or zinc oxide (ZnO), for example. On the top surface 10a of the first substrate 10, a plurality of film bulk acoustic resonators 11 are formed by a thin film of piezoelectric material. The film bulk acoustic resonators 11 are connected to each other by wiring pads 12 to form an electronic circuit 18 such as a filter or a filter device. It is to be appreciated that, although the electronic circuit 18 is described to include the film bulk acoustic resonators 11, according to aspects of the present invention, surface acoustic wave (SAW) elements or bulk acoustic wave (BAW) elements such as solidly mounted resonators (SMRs) can be used in addition to or instead of the film bulk acoustic resonators 11.

An external electrode 40 is formed on the bottom surface 10b of the first substrate 10. The external electrode 40 is formed by a via 41 and an external electrode layer 42. The via 41 is formed through a through-hole 10c extending between the top surface 10a and the bottom surface 10b of the first substrate 10. The external electrode layer 42 is formed on a bottom surface of the via 41. The via 41 is formed by copper plating and the external electrode layer 42 is formed by solder plating. The via 41 is connected to a wiring pad 12 of the electronic circuit 18 formed on the top surface 10a of the first substrate 10. The column 50 is formed immediately above the via 41 by the wiring pad 12.

As shown in FIG. 14, the film bulk acoustic resonators $11_1$-$11_7$ are appropriately connected by wiring pads 12 such that a bandpass filter configured similarly to the circuit diagram of FIG. 2 is formed on the top surface 10a of the first substrate 10. In particular, the film bulk acoustic resonators $11_1$, $11_3$, $11_5$, $11_7$ are connected in series along a signal path extending between a column $50_1$ as input electrode and a column $50_2$ as output electrode. Further, the film bulk acoustic resonators $11_2$, $11_4$, $11_6$ are connected in parallel between the columns $50_3$, $50_4$ as ground and respective nodes joining the film bulk acoustic resonators $11_1$, $11_3$, $11_5$, $11_7$. Thus, the respective nodes joining the film bulk acoustic resonators $11_1$, $11_3$, $11_5$ are connected to the column $50_3$ as ground through the respective film bulk acoustic resonators $11_2$, $11_4$. The node joining the film bulk acoustic resonators $11_5$, $11_7$ is connected to the column $50_4$ as ground through the film bulk acoustic resonator $11_6$. Here, the film bulk acoustic resonators 11 of FIG. 13 are schematically shown as an exemplary arrangement of the film bulk acoustic resonators $11_1$-$11_7$ of FIG. 14. Further, the external electrode 40, the via 41, the column 50 and the like of FIGS. 13 and 5B are schematically shown as an exemplary arrangement of the columns $50_1$-$50_4$ of FIG. 14. It is to be appreciated that, also according to the third example, at least one of the vias $41_3$, $41_4$ as ground may be connected to the side wall 30 similarly to the alternative example of the first example shown in FIG. 8.

The second substrate 20 is formed of low-resistivity material such as a semiconductor. The second substrate 20 may be formed of silicon, for example A thin film 22 made of high-resistivity material such as a dielectric is formed on the bottom surface 20a of the second substrate 20. The thin film 22 may be formed of silicon dioxide ($SiO_2$) or aluminum oxide ($Al_2O_3$), for example.

The first substrate 10 and the second substrate 20 are supported by the side wall 30 and the column 50 and separated to have a certain gap between the top surface 10a of the first substrate 10 and the bottom surface 20a of the second substrate 20. The side wall 30 extends along a periphery 10d of the first substrate 10 and a periphery 20d of the second substrate 20 to surround the electronic circuit 18 formed on the top surface 10a of the first substrate 10. The top surface 10a of the first substrate 10, the bottom surface 20a of the second substrate 20, and the side wall 30 define a cavity 19 internally including the electronic circuit 18. The side wall 30 is formed by a first side wall 31 and a second side wall 32 sequentially stacked between the top surface 10a of the first substrate 10 and the bottom surface 20a of the second substrate 20 and bonded with each other using a transient liquid phase (TLP) bonding such that the first side wall 31 is formed of gold-tin (Au—Sn) alloy and the second side wall 32 is formed of tin-copper (Sn—Cu) alloy.

The column 50 is formed immediately above the via 41 of the first substrate 10 on the wiring pad 12 to support the second substrate 20 by the thin film 22. The column 50 is formed by a first column 51 and a second column 52 sequentially stacked between the wiring pad 12 formed on the top surface 10a of the first substrate 10 and the thin film 22 formed on the bottom surface 20a of the second substrate 20 and bonded with each other using transient liquid phase (TLP) bonding such that the first column 51 is formed of gold-tin (Au—Sn) alloy and the second column 52 is formed of tin-copper (Sn—Cu) alloy.

According to the third example, the thin film 22 made of high-resistivity material is formed on the bottom surface 20a of the second substrate 20 made of low-resistivity material. The thin film 22 can prevent an RF signal emitted by the electronic circuit 18 from being coupled to the second substrate 20 through the side wall 30, the column 50, or a space of the cavity 19. The thin film 22 is formed of a high-resistivity material such as a dielectric to have a certain thickness, such that the RF signal emitted from the electronic circuit 18 can be blocked. The thin film 22 on the bottom surface 20a of the second substrate 20 may be formed to cover certain regions including portions immediately above the side wall 30, the column 50 and the electronic circuit 18. Further, the thin film 22 may be formed to entirely cover the bottom surface 20a of the second substrate 20.

The electronic device 1 of the third example may be manufactured by a series of steps described below. An electronic circuit 18 is formed to include film bulk acoustic resonators (FBARs) 11 on a top surface 10a of a first substrate 10 made of piezoelectric material and having a certain thickness. The first substrate 10 may be formed of aluminum nitride (AlN) or zinc oxide (ZnO). On the top surface 10a of the first substrate 10, the film bulk acoustic resonators 11 are appropriately connected by wiring pads 12 to configure the electronic circuit 18 such as a filter and a filter device. It is to be appreciated that, although the electronic circuit 18 includes film bulk acoustic resonators 11, according to aspects of the present invention, a surface acoustic wave (SAW) element or a bulk acoustic wave (BAW) element such as a solidly mounted resonator (SMR) can be used in addition to or instead of the film bulk acoustic resonators 11.

Concurrently with, after or before forming the electronic circuit 18 on the top surface 10a of the first substrate 10, a first side wall 31 is formed to have a certain width and height and surround the electronic circuit 18 along a periphery 10d of the first substrate 10. The first side wall 31 may be formed of tin (Sn) or indium (In), for example. Similarly, a first column 51 is formed to have a certain diameter and height on the top surface 10a of the first substrate 10 by a wiring pad 12 and immediately above a through-hole 10c where a via 41 is formed. The first column 51 may be formed of tin (Sn) or indium (In), for example. Meanwhile, the through-hole 10c is formed to passing through between the top surface 10a and the bottom surface 10b of the first substrate. Next, the via 41 is formed by copper plating to connect to the wiring pad 12 of the electronic circuit 18 through the through-hole 10c, and an external electrode layer 42 is formed by solder plating on a bottom surface of the via 41, such that an external electrode 40 can be formed by the via 41 and the external electrode layer 42.

A thin film 22 made of high-resistivity material is formed to have a certain thickness on a bottom surface 20a of the second substrate 20 made of low-resistivity material and having a certain thickness. The second substrate 20 may be formed of a semiconductor such as silicon. The thin film 22 may be formed of a dielectric such as silicon dioxide ($SiO_2$) or aluminum oxide ($Al_2O_3$). The thin film 22 on the bottom surface 20a of the second substrate 20 may be formed to cover certain regions including portions immediately above the side wall 30, the column 50 and the electronic circuit 18. Further, the thin film 22 may be formed to entirely cover the bottom surface 20a of the second substrate 20.

After the thin film 22 is formed on the bottom surface 20a of the second substrate 20, a second side wall 32 is formed to have a certain width and height and surround the electronic circuit 18 along a periphery 20d of the second substrate 20 in a location where the first side wall 31 is formed on the top surface 10a of the first substrate 10. The second side wall 32 may be formed by sequentially stacking copper (Cu) and gold (Au), for example. Similarly, a second column 52 is formed to have a certain diameter and height in a location where the first column 51 is formed on the top surface 10a of the first substrate 10. The second column 52 may be formed by sequentially stacking copper (Cu) and gold (Au), for example.

The top surface 10a of the first substrate 10 is positioned to oppose the bottom surface 20a of the second substrate 20, and then top surfaces of the first side wall 31 and the first column 51 both formed on the top surface 10a of the first substrate 10 are aligned with bottom surfaces of the second side wall 32 and the second column 52 both formed on the bottom surface 20a of the second substrate 20. Next, the stacked side walls 31, 32 are bonded by transient liquid phase (TLP) bonding at a certain temperature over a certain time. The transient liquid phase bonding allows the first side wall 31 to be gold-tin or gold-indium alloy for example, and the second side wall 32 to be gold-copper alloy, for example, such that the first side wall 31 and the second side wall 32 are integrally formed into the side wall 30. The side wall 30 supports the first substrate 10 and the second substrate 20 and maintains the top surface 10a of the first substrate 10 and the bottom surface 20a of the second substrate 20 to be separated by a certain gap, and therefore defines a cavity 19 together with the top surface 10a of the first substrate 10 and the bottom surface 20a of the second substrate 20 such that the electronic circuit 18 is internally included in the cavity 19. Similarly, the transient liquid phase bonding allows the first column 51 to be gold-tin or gold-indium alloy, for example, and the second column 52 to be gold-copper alloy, for example, such that the first column 51 and the second column 52 are integrally formed into the column 50. The column 50 supports the first substrate 10 and the second substrate 20 and maintains the top surface 10a of the first substrate 10 and the bottom surface 20a of the second substrate 20 to be separated by a certain gap.

Figure 15:
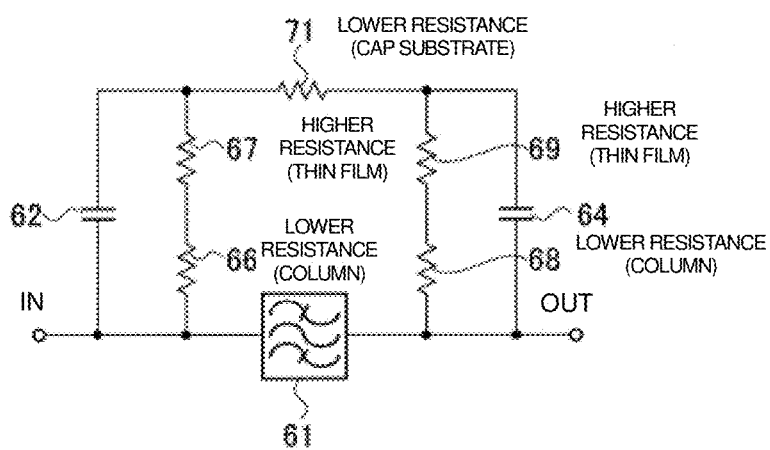
FIG. 15 shows an equivalent circuit of the electronic device FIG. 13.

FIG. 15 is a circuit diagram showing an equivalent circuit of the electronic device 1 of the third example. In the equivalent circuit, a bandpass filter 61 corresponds to the bandpass filter configured by the electronic circuit 18 of the third example. The bandpass filter has a configuration similar to that of the ladder-type filter shown in FIG. 2. Also in the third example, an RF signal emitted by an electronic circuit 18 can be coupled to the second substrate 20 as the cap substrate through the side wall 30, the column 50, or a space of the cavity 19, such that a path can be created to bypass the bandpass filter 61 between an input-side line and an output-side line of the electronic circuit 18. In the figure, the path is equivalently shown by: a resistor 71 corresponding to the second substrate 20; a first capacitor 62 coupling the input-side line of the electronic circuit 18 to the second substrate 20; a resistor 66 corresponding to the column 50 along a path from the input-side line of the electronic circuit 18 to the second substrate 20 via the column 50 and the thin film 22 and a resistor 67 corresponding to the thin film 22; and a resistor 69 corresponding to the thin film 22 along a path from the second substrate 20 to the output-side line of the electronic circuit 18 via the column 50 and a resistor 68 corresponding to the column 50.

Figure 1:
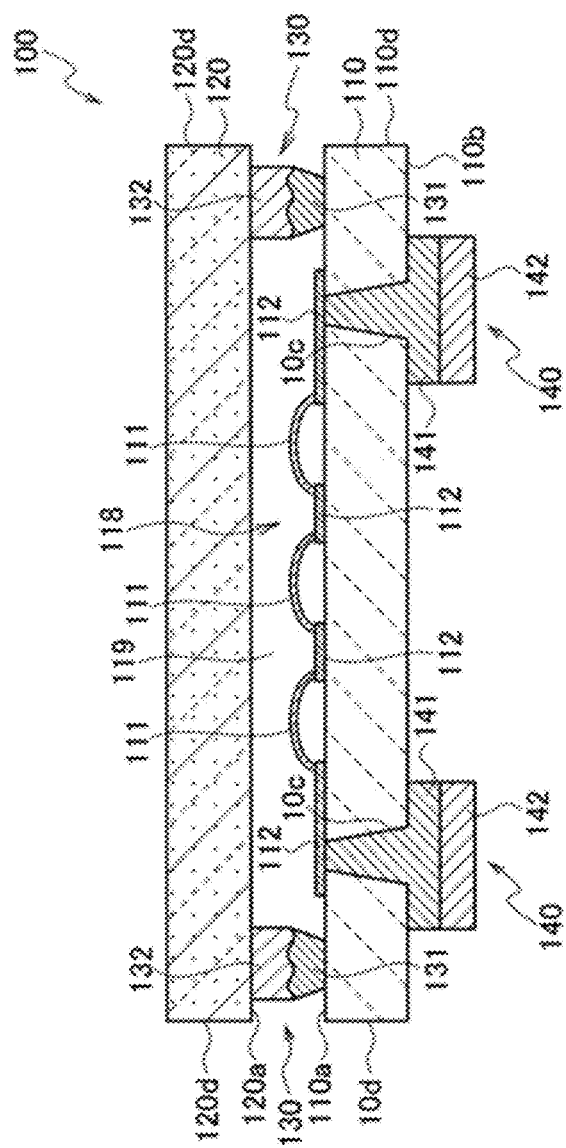
FIG. 1 is a cross-sectional view schematically showing a configuration of an exemplary conventional electronic device.

According to the third example, the resistor 71 corresponding to the second substrate 20 formed of low-resistivity material and the resistors 66, 68 corresponding to the column 50 formed of metal have lower resistance, while the resistors 67, 69 corresponding to the thin film 22 formed of high-resistivity material have a higher resistance. Further, the first capacitor 62 and the second capacitor 64 have a lower capacitance than the capacitors 152 and 154 of the equivalent circuit illustrated in FIG. 3. A current bypassing the bandpass filter 61 and passing through the resistor 71 corresponding to the second substrate 20 may be less than a current bypassing the bandpass filter 151 and passing through the resistor 153 of the equivalent circuit illustrated in FIG. 3. A contribution of such a bypassing path to the bandpass filter 61 would be suppressed to be smaller than that of the bypassing path to the bandpass filter 151 of the equivalent circuit illustrated in FIG. 3. Therefore, according to the third example, an RF signal emitted by the electronic circuit 18 can be prevented from being coupled to the second substrate 20 as the cap substrate, such that the frequency characteristics of the electronic device 1 can be improved as compared to those of the electronic circuit 100 of FIG. 1. Specifically, for example, pass loss of the bandpass filter 61 may be reduced as compared to the pass loss of the bandpass filter 151 of the equivalent circuit illustrated in FIG. 3.

According to the third example, the first substrate 10 and the second substrate 20 are supported not only by the side wall 30 but also by the column 50. Therefore, mechanical strength and robustness can be ensured in the electronic device 1 of the third example.

Figure 16:
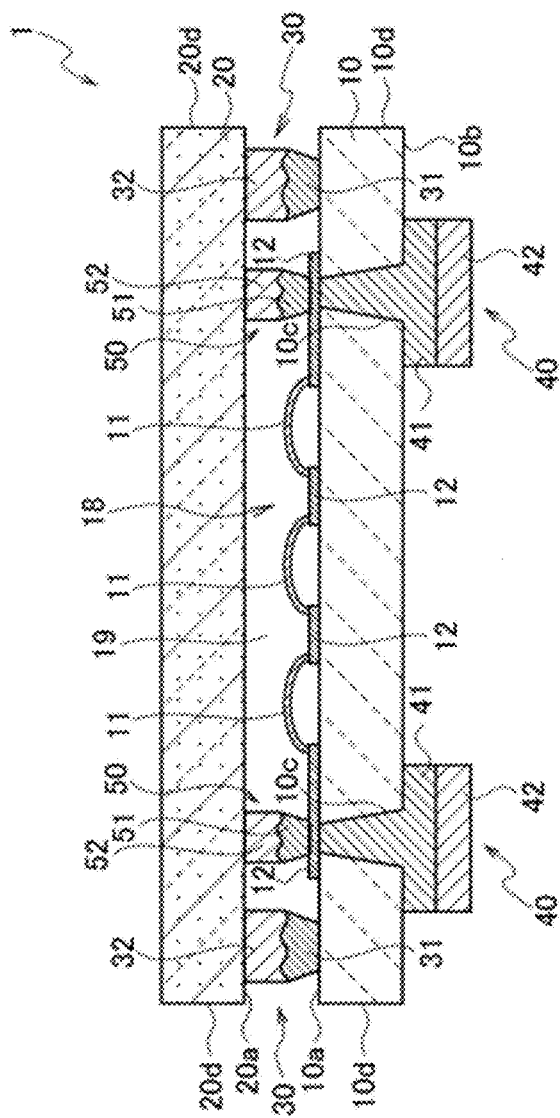
FIG. 16 is a cross-sectional view schematically showing a configuration of an electronic device according to a fourth example.

A fourth example is directed to a configuration in which a cap substrate is formed of high-resistivity material and also a column is formed between the cap substrate and a device substrate. FIG. 16 is a cross-sectional view schematically showing a configuration of an electronic device according to the fourth example. The fourth example is different from the second example in that the column is formed. The other configurations are similar to those of the second example. In FIG. 16, components common with the second example are indicated by like reference symbols in order to clarify the correspondence relationship with the second example. The description below directed to the fourth example still refer to FIG. 5B for the side view illustrating the electronic device of the first example, and FIG. 14 for the other cross-sectional view illustrating the electronic circuit of the third example.

As shown in FIGS. 16, 14 and 5B, an electronic device 1 of the fourth example includes a first substrate 10 having a certain thickness and a second substrate 20 having a certain thickness and opposing the first substrate 10 with a certain gap. The first substrate 10 may be referred to as a device substrate and has a top surface 10a opposing the second substrate 20. On the top surface 10a, an electronic circuit 18 including a film bulk acoustic resonator (FBAR) 11 is formed. The second substrate 20 may be referred to as a cap substrate and has a bottom surface 20a supported by a side wall 30 and a column 50 to maintain a certain gap from the top surface 10a of the first substrate 10. The top surface 10a of the first substrate 10, the bottom surface 20a of the second substrate 20, and the side wall 30 define a cavity 19 internally including the electronic circuit 18 formed on the top surface 10a of the first substrate 10.

The first substrate 10 may be formed of piezoelectric material including aluminum nitride (AlN) or zinc oxide (ZnO), for example. On the top surface 10a of the first substrate 10, a plurality of film bulk acoustic resonators 11 are formed by a thin film of piezoelectric material. The film bulk acoustic resonators 11 are connected to each other by wiring pads 12 to form an electronic circuit 18 such as a filter or a filter device. It is to be appreciated that, although the electronic circuit 18 in described to include the film bulk acoustic resonators 11, according to aspects of the present invention, surface acoustic wave (SAW) elements or bulk acoustic wave (BAW) elements such as solidly mounted resonators (SMRs) can be used in addition to or instead of the film bulk acoustic resonators 11.

An external electrode 40 is formed on the bottom surface 10b of the first substrate 10. The external electrode 40 is formed by a via 41 and an external electrode layer 42. The via 41 is formed through a through-hole 10c extending between the top surface 10a and the bottom surface 10b of the first substrate 10. The external electrode layer 42 is formed on a bottom surface of the via 41. The via 41 is formed by copper plating and the external electrode layer 42 is formed by solder plating. The via 41 is connected to a wiring pad 12 of the electronic circuit 18 formed on the top surface 10*a* of the first substrate 10. The column 50 is formed immediately above the via 41 by the wiring pad 12.

As shown in FIG. 14, the film bulk acoustic resonators 11$_1$-11$_7$ are appropriately connected by wiring pads 12 such that a bandpass filter configured similarly to the circuit diagram of FIG. 2 is formed on the top surface 10*a* of the first substrate 10. In particular, the film bulk acoustic resonators 11$_1$, 11$_3$, 11$_5$, 11$_7$ are connected in series along a signal path extending between a column 50$_1$ as an input electrode and a column 50$_2$ as an output electrode. Further, the film bulk acoustic resonators 11$_2$, 11$_4$, 11$_6$ are connected in parallel between the columns 50$_3$, 50$_4$ as ground and respective nodes joining the film bulk acoustic resonators 11$_1$, 11$_3$, 11$_5$, 11$_7$. Thus, the respective nodes joining the film bulk acoustic resonators 11$_1$, 11$_3$, 11$_5$ are connected to the column 50$_3$ as ground through the respective film bulk acoustic resonators 11$_2$, 11$_4$. The node joining the film bulk acoustic resonators 11$_5$, 11$_7$ is connected to the column 50$_4$ as ground through the film bulk acoustic resonator 11$_6$. Here, the film bulk acoustic resonators 11 of FIG. 16 are schematically shown as an exemplary arrangement of the film bulk acoustic resonators 11$_1$-11$_7$ of FIG. 14. Further, the external electrode 40, the via 41, the column 50 and the like of FIGS. 16 and 5B are schematically shown as an exemplary arrangement of the columns 50$_1$-50$_4$ of FIG. 14. It is to be appreciated that, also according to the fourth example, at least one of the vias 41$_3$, 41$_4$ as ground may be connected to the side wall 30 similarly to the alternative example of the first example shown in FIG. 8.

The second substrate 20 is formed of low-resistivity material such as dielectric. The second substrate 20 may be formed of silicon dioxide (SiO$_2$) or aluminum oxide (Al$_2$O$_3$), for example.

The first substrate 10 and the second substrate 20 are supported by the side wall 30 and the column 50 and separated to have a certain gap between the top surface 10*a* of the first substrate 10 and the bottom surface 20*a* of the second substrate 20. The side wall 30 extends along a periphery 10*d* of the first substrate 10 and a periphery 20*d* of the second substrate 20 to surround the electronic circuit 18 formed on the top surface 10*a* of the first substrate 10. The top surface 10*a* of the first substrate 10, the bottom surface 20*a* of the second substrate 20, and the side wall 30 define a cavity 19 internally including the electronic circuit 18. The side wall 30 is formed by a first side wall 31 and a second side wall 32 sequentially stacked between the top surface 10*a* of the first substrate 10 and the bottom surface 20*a* of the second substrate 20 and bonded with each other using a transient liquid phase (TLP) bonding such that the first side wall 31 is formed of gold-tin (Au—Sn) alloy and the second side wall 32 is formed of tin-copper (Sn—Cu) alloy.

The column 50 is formed immediately above the via 41 of the first substrate 10 on the wiring pad 12 to support the second substrate 20. The column 50 is formed by a first column 51 and a second column 52 sequentially stacked between the wiring pad 12 formed on the top surface 10*a* of the first substrate 10 and the bottom surface 20*a* of the second substrate 20 and bonded with each other using transient liquid phase (TLP) bonding such that the first column 51 is formed of gold-tin (Au—Sn) alloy and the second column 52 is formed of tin-copper (Sn—Cu) alloy.

According to the fourth example, the second substrate 20 is formed of high-resistivity material. The high-resistivity material forming the second substrate 20 can prevent an RF signal emitted by the electronic circuit 18 from being coupled to the second substrate 20 through the side wall 30, the column 50, or a space of the cavity 19, such that the RF signal is blocked from flowing into the second substrate 20. The second substrate 20 is formed of high-resistivity material such as a dielectric, such that a path of the RF signal emitted from the electronic circuit 18 passing through the second substrate 20 cannot be created.

The electronic device 1 of the fourth example may be manufactured by a series of steps described below. An electronic circuit 18 is formed to include film bulk acoustic resonators (FBARs) 11 on a top surface 10*a* of a first substrate 10 made of piezoelectric material and having a certain thickness. The first substrate 10 may be formed of aluminum nitride (AlN) or zinc oxide (ZnO). On the top surface 10*a* of the first substrate 10, the film bulk acoustic resonators 11 are appropriately connected by wiring pads 12 to configure the electronic circuit 18 such as a filter and a filter device. It is to be appreciated that, although the electronic circuit 18 includes film bulk acoustic resonators 11, according to aspects of the present invention, a surface acoustic wave (SAW) element or a bulk acoustic wave (BAW) element such as a solidly mounted resonator (SMR) can be used in addition to or instead of the film bulk acoustic resonators 11.

Concurrently with, after or before forming the electronic circuit 18 on the top surface 10*a* of the first substrate 10, a first side wall 31 is formed to have a certain width and height and surround the electronic circuit 18 along a periphery 10*d* of the first substrate 10. The first side wall 31 may be formed of tin (Sn) or indium (In), for example. Similarly, a first column 51 is formed to have a certain diameter and height on the top surface 10*a* of the first substrate 10 by a wiring pad 12 and immediately above a through-hole 10*c* where a via 41 is formed. The first column 51 may be formed of tin (Sn) or indium (In), for example. Meanwhile, the through-hole 10*c* is formed to passing through between the top surface 10*a* and the bottom surface 10*b* of the first substrate. Next, the via 41 is formed by copper plating to connect to the wiring pad 12 of the electronic circuit 18 through the through-hole 10*c*, and an external electrode layer 42 is formed by solder plating on a bottom surface of the via 41, such that an external electrode 40 can be formed by the via 41 and the external electrode layer 42.

On the bottom surface 20*a* of the second substrate 20 formed of high-resistivity material and having a certain thickness, a second side wall 32 is formed to have a certain width and height and surround the electronic circuit 18 along a periphery 20*d* of the second substrate 20 in a location where the first side wall 31 is formed on the top surface 10*a* of the first substrate 10. The second substrate 20 may be formed of silicon dioxide (SiO$_2$) or aluminum oxide (Al$_2$O$_3$), for example. The second side wall 32 may be formed by sequentially stacking copper (Cu) and gold (Au), for example. Similarly, a second column 52 is formed to have a certain diameter and height in a location where the first column 51 is formed on the top surface 10*a* of the first substrate 10. The second column 52 may be formed by sequentially stacking copper (Cu) and gold (Au), for example.

The top surface 10*a* of the first substrate 10 is positioned to oppose the bottom surface 20*a* of the second substrate 20, and then top surfaces of the first side wall 31 and the first column 51 both formed on the top surface 10*a* of the first substrate 10 are aligned with bottom surfaces of the second side wall 32 and the second column 52 both formed on the bottom surface 20*a* of the second substrate 20. Next, the stacked side walls 31, 32 are bonded by transient liquid phase (TLP) bonding at a certain temperature over a certain time. The transient liquid phase bonding allows the first side wall 31 to be gold-tin or gold-indium alloy, for example, and the second side wall 32 to be gold-copper alloy, for example, such that the first side wall 31 and the second side wall 32 are integrally formed into the side wall 30. The side wall 30 supports the first substrate 10 and the second substrate 20 and maintains the top surface 10a of the first substrate 10 and the bottom surface 20a of the second substrate 20 to be separated by a certain gap, and therefore defines a cavity 19 together with the top surface 10a of the first substrate 10 and the bottom surface 20a of the second substrate 20 such that the electronic circuit 18 is internally included in the cavity 19. Similarly, the transient liquid phase bonding allows the first column 51 to be gold-tin or gold-indium alloy, for example, and the second column 52 to be gold-copper alloy, for example, such that the first column 51 and the second column 52 are integrally formed into the column 50. The column 50 supports the first substrate 10 and the second substrate 20 and maintains the top surface 10a of the first substrate 10 and the bottom surface 20a of the second substrate 20 to be separated by a certain gap.

Figure 17:
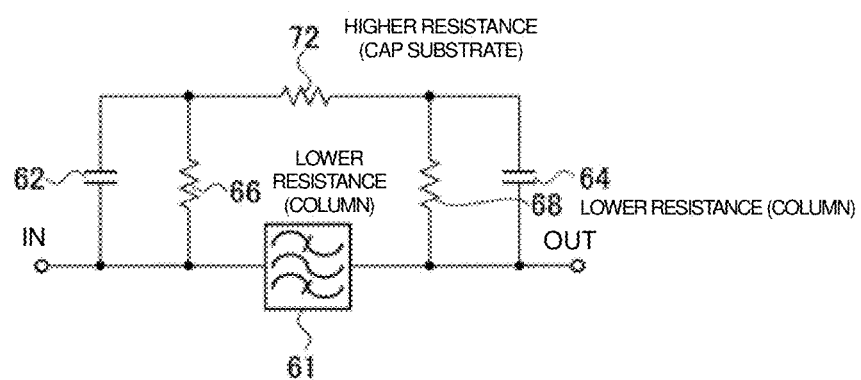
FIG. 17 shows an equivalent circuit of the electronic device of FIG. 16.

FIG. 17 is a circuit diagram showing an equivalent circuit of the electronic device 1 according to the fourth example. In the equivalent circuit, a bandpass filter 61 corresponds to the bandpass filter configured by the electronic circuit 18 of the fourth example. The bandpass filter has a configuration similar to that of the ladder-type filter shown in FIG. 2. Also in the fourth example, an RF signal emitted by an electronic circuit 18 can be coupled to the second substrate 20 as the cap substrate through the side wall 30, the column 50, or a space of the cavity 19, such that a path can be created to bypass the bandpass filter 61 between an input-side line and an output-side line of the electronic circuit 18. In the figure, the path is equivalently shown by: a resistor 72 corresponding to the second substrate 20; a first capacitor 62 coupling the input-side line of the electronic circuit 18 to the second substrate 20; a resistor 66 corresponding to a path from the input-side line of the electronic circuit 18 to the second substrate 20 via the column 50; a resistor 68 corresponding to a path from the second substrate 20 to the output-side line of the electronic circuit 18 via the column 50; and a second capacitor 64 coupling the second substrate 20 to the output-side line of the electronic circuit 18.

According to the fourth example, the resistors 66, 68 corresponding to the column 50 formed of metal have lower resistance, while the resistor 71 corresponding to the second substrate 20 formed of high-resistivity material has higher resistance than the resistor 153 in the equivalent circuit illustrated in FIG. 3. Further, the first capacitor 62 and the second capacitor 64 have lower capacitance than the capacitors 152 and 154 in the equivalent circuit illustrated in FIG. 3. A current bypassing the bandpass filter 61 and passing through the resistor 71 corresponding to the second substrate 20 may be less than a current bypassing the bandpass filter 151 and passing through the resistor 153 of the equivalent circuit illustrated in FIG. 3. A contribution of such a bypassing path to the bandpass filter 61 would be suppressed to be smaller than that of the bypassing path to the bandpass filter 151 of the equivalent circuit illustrated in FIG. 3. Therefore, according to the third example, an RF signal emitted by the electronic circuit 18 can be prevented from being coupled to the second substrate 20 as the cap substrate, such that the frequency characteristics of the electronic device 1 can be improved as compared to those of the electronic circuit 100 of FIG. 1. Specifically, for example, pass loss of the bandpass filter 61 may be reduced as compared to the pass loss of the bandpass filter 151 of the equivalent circuit illustrated in FIG. 3.

According to the fourth example, the first substrate 10 and the second substrate 20 are supported not only by the side wall 30 but also the column 50. Therefore, mechanical strength and robustness can be ensured in the electronic device 1 of the fourth example.

Figure 18A:
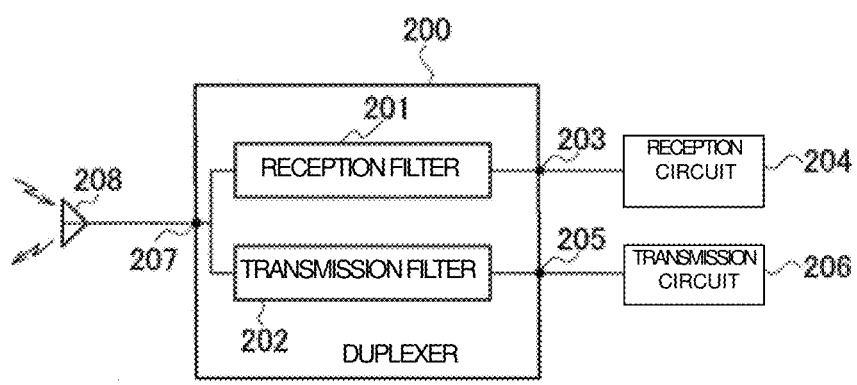
FIG. 18A is a block diagram schematically showing a configuration of an antenna duplexer to which the electronic device may be applied.

FIG. 18A is a block diagram schematically showing a configuration of an antenna duplexer to which an electronic device in accordance with aspects of the present invention is applied. The duplexer 200 can be configured to include a reception filter 201 and a transmission filter 202, each of which can include a bandpass filter configured as an electronic device 1 as described above so that a first frequency and a second frequency may pass respectively through the reception filter 201 and the transmission filter 202. The duplexer 200 can include a common terminal 207 that can be used as antenna terminal that can be connected to an antenna 208, a first terminal 205 that can be used as transmission terminal that can be connected to a transmission circuit 206, and a second terminal 203 that can be used as reception terminal that can be connected to a reception circuit 204. The transmission circuit 206 and reception circuit 204 may be disposed in the same module, or in the same package as the duplexer 200, or they may be disposed in a module or package that is external to the duplexer 200.

Figure 18B:
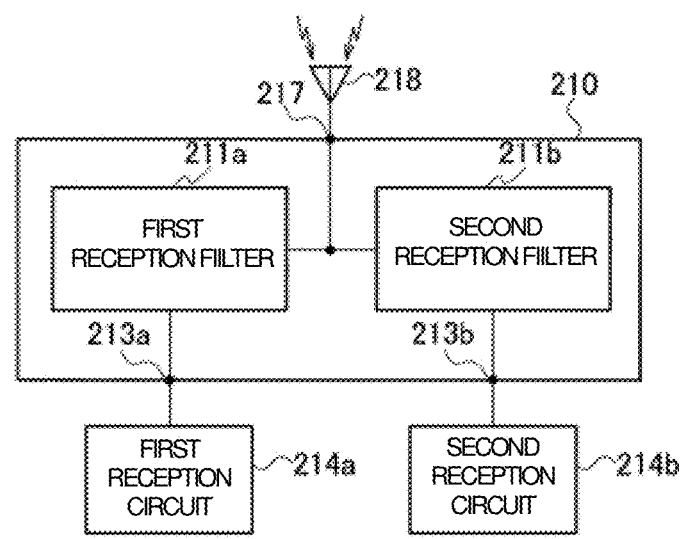
FIG. 18B is a block diagram schematically showing a configuration of an antenna diplexer to which the electronic device may be applied.

FIG. 18B is a block diagram schematically showing a configuration of a diplexer to which an electronic device in accordance with aspects of the present invention is applied. The diplexer 210 includes a first reception filter 211a and a second reception filter 211b, each of which is connected to a common terminal 217. In accordance with an aspect of the present disclosure, the bandpass filter configured as the electronic device 1 can be used in the first reception filter 211a and/or the second reception filter 211b. The diplexer 210 can include a common terminal 217 that can be connected to an antenna 218 to receive signals having different frequencies. The diplexer 210 can further include a first terminal 213a that can be used as first reception terminal, and a second terminal 213b that can be used as second reception terminal. The first terminal 213a can be connected to the first reception circuit 214a configured to receive a signal of a first frequency band. The second terminal 213b can be connected to the second reception circuit 721b configured to receive a signal of a first frequency band different from the second frequency band.

Figure 19A:
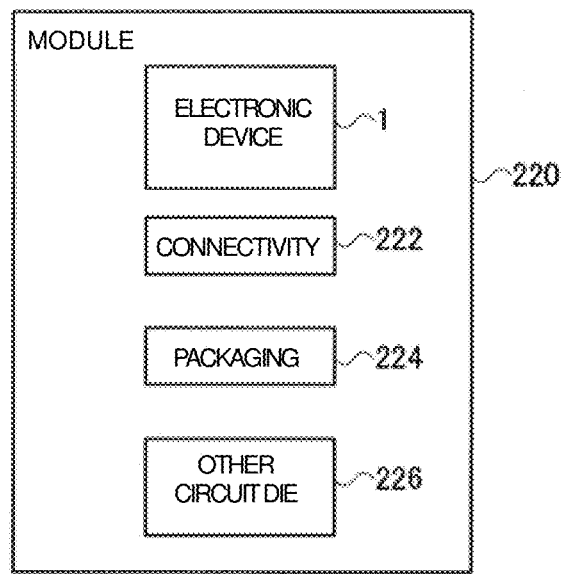
FIG. 19A is a block diagram schematically showing a configuration of a module that includes the electronic device.
Figure 19B:
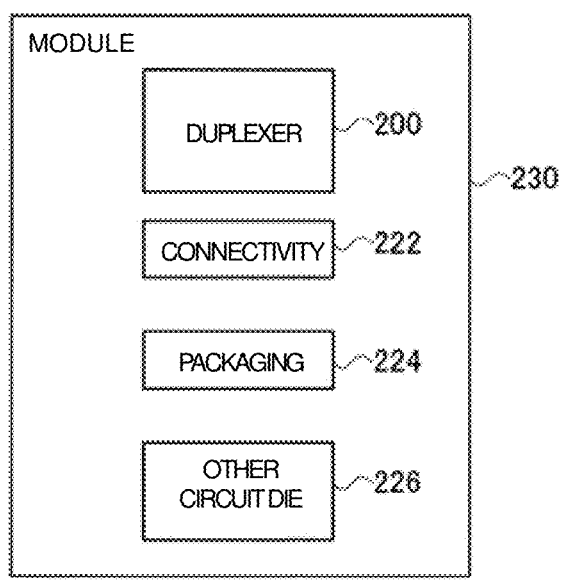
FIG. 19B is a block diagram schematically showing a configuration of a module that includes the duplexer.
Figure 19C:
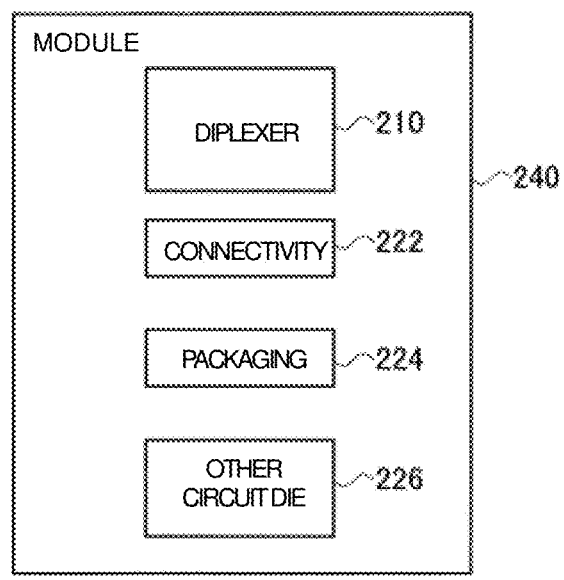
FIG. 19C is a block diagram schematically showing a configuration of a module that includes the diplexer.

It is to be appreciated that the electronic device 1 according to aspects of the present invention can be applied to a mobile communication device and the like. For example, a bandpass filter configured as an electronic device 1, and a duplexer 200 or a diplexer 210 including an electronic device 1 may be incorporated into and packaged as a module that may ultimately be used in electronic equipment, such as a wireless communication device, for example. FIG. 19A is a block diagram schematically showing an example of a module 220 that includes an electronic device 1. The module 220 further includes connectivity 222 to provide signal interconnections, packaging 224, for example, a package substrate, for packaging of the circuit, and other circuit die 226, such as amplifiers, pre-filters, modulators, demodulators, down converters, and the like, as would be known to those skilled in the art of semiconductor fabrication in view of the disclosure herein. FIGS. 19B and 19C are block diagrams illustrating other examples of a module 230, 240 including an embodiment of the duplexer 200 or diplexer 210 respectively, either of which may incorporate an embodiment of the electronic device 1, as discussed above with reference to FIGS. 18A and 18B.

The electronic device 1, duplexer 200, diplexer 210, or any of the modules 220, 230, 240, according to examples and embodiments disclosed herein may be useful in a variety of electronic equipment, such as communications or wireless devices (e.g., cell phones, tablets, etc.).

Figure 20A:
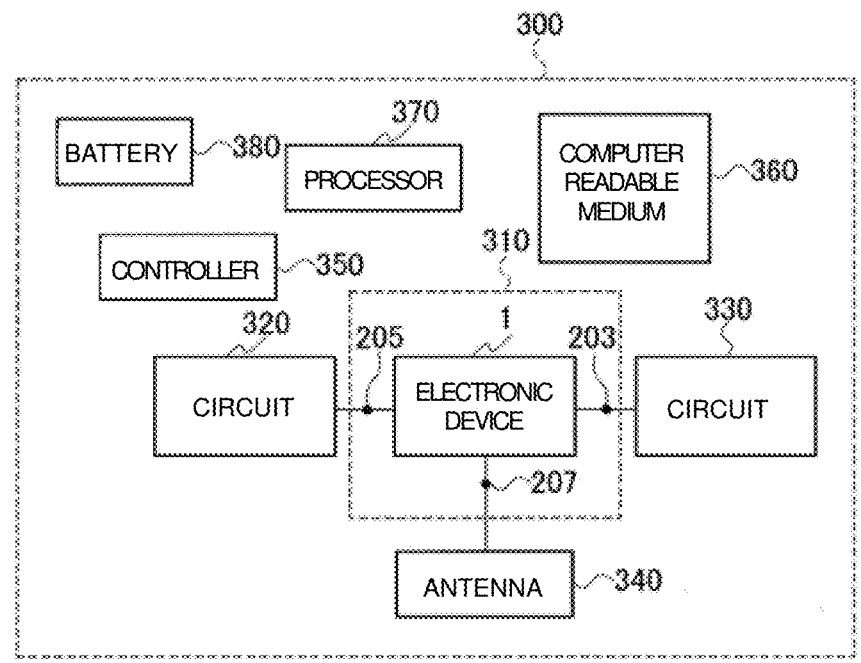
FIG. 20A is a block diagram schematically showing a configuration of an electronic equipment to which the electronic device may be applied.

FIG. 20A is a block diagram schematically showing an example of the electronic equipment 300 that can include an embodiment of the electronic device 1. For instance, the exemplary electronic equipment 300 can include the electronic device 1, duplexer 200 or diplexer 210. The exemplary electronic equipment 300 can be a mobile phone, such as a smart phone. The electronic equipment 300 can include elements that are not illustrated in FIG. 20A and/or a sub-combination of the illustrated elements. The electronic device 300 depicted in FIG. 20A can represent a multi-band and/or multi-mode device such as a multi-band/multi-mode mobile phone. By way of example, the electronic device 300 can be a wireless device that communicates in accordance with Long Term Evolution (LTE). In this example, the electronic equipment 300 can be configured to operate at one or more frequency bands defined by an LTE standard. The electronic equipment 300 can alternatively or additionally be configured to communicate in accordance with one or more other communication standards, including but not limited to one or more of a Wi-Fi standard, a Bluetooth standard, a 3G standard, a 4G standard or an Advanced LTE standard.

The electronic equipment 300 can include a filter module 310. The filter module 310 includes one or more embodiments of the electronic device 1 and is connected to circuits 320 and 330 via terminal 205 and 203 respectively. The electronic equipment 300 can further include an antenna 340 connected to the filter module 310 via a common terminal 207. The filter module 310 can include any of the modules 220, 230 and 240 discussed above with reference to FIGS. 19A-C. The circuits 320 and 330 can be reception or transmission circuits that can generate RF signals for transmission via the antenna 340 or receive incoming signals from the antenna 340.

Figure 20B:
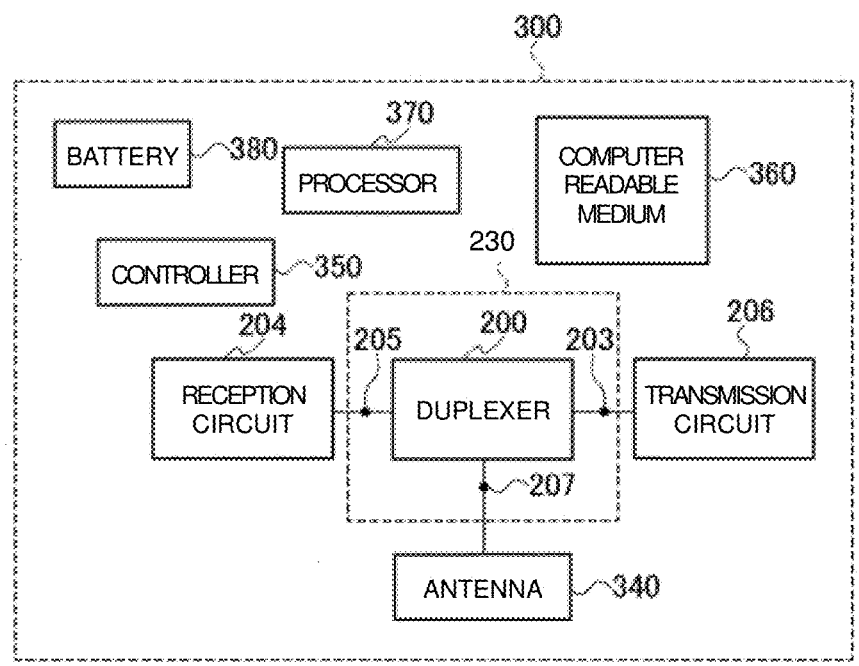
FIG. 20B is a block diagram schematically showing a configuration of another electronic equipment to which the electronic device may be applied.

Referring to FIG. 20B, the filter module 310 of FIG. 20A includes a module 230 including a duplexer 200. In this example, the electronic equipment 300 can include the duplexer 200, the transmission circuit 206 connected to the duplexer 200 via input terminal 205, the reception circuit 204 connected to the duplexer 200 via the output terminal 203, and the antenna 340 connected to the duplexer via antenna terminal 207. The transmission circuit 206 and reception circuit 204 may be part of a transceiver that can generate RF signals for transmission via the antenna 340 and can receive incoming RF signals from the antenna 340.

As shown in FIGS. 20A and 20B, the communication device 300 can further include a controller 350, at least one computer readable medium 360, at least one processor 370, and a battery 380.

It will be understood that various functionalities associated with the transmission and receiving of RF signals can be achieved by one or more components that are represented in FIG. 20B as the transmission circuit 206 and the reception circuit 204. For example, a single component can be configured to provide both transmission and reception functionalities. In another example, transmission and reception functionalities can be provided by separate components. Similarly, it will be understood that various antenna functionalities associated with the transmission and reception of RF signals can be achieved by one or more components that are collectively represented in FIGS. 20A and 20B as the antenna 340. For example, a single antenna can be configured to provide both transmission and reception functionalities. In another example, transmission and reception functionalities can be provided by separate antennas. In yet another example in which the communication device is a multi-band device, different bands associated with the communication device 300 can be provided with different antennas.

To facilitate switching between receive and transmit paths, the duplexer 200 can be configured to electrically connect the antenna 340 to a selected transmission or reception path. Thus, the duplexer 200 can provide a number of switching functionalities associated with an operation of the communication device 300. In addition, as discussed above, the duplexer 200 includes the transmission filter 202 and reception filter 201 (see FIG. 18A) that are configured to provide filtering of the RF signals.

As shown in FIGS. 20A and 20B, in certain embodiments, a controller 350 can be provided for controlling various functionalities associated with operations of the filter module 310 (e.g., duplexer 200) and/or other operating component(s). In certain embodiments, at least one processor 370 can be configured to facilitate implementation of various processes for operation of the communication device 300. The processes performed by the at least one processor 370 may be implemented by computer program instructions. These computer program instructions may be provided to the at least one processor 370, which can be a general purpose computer, a special purpose computer, or another programmable data processing apparatus to produce a machine, such that the instructions, which execute via the at least one processor of the computer or other programmable data processing apparatus, create a mechanism for operating the communication device 300. In certain embodiments, these computer program instructions may also be stored in the computer-readable medium 360. The battery 380 can be any suitable battery for use in the communication device 300, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An electronic device comprising:
   a first substrate having a top surface on which an electronic circuit including a bulk acoustic wave (BAW) resonator is formed, the first substrate being formed of piezoelectric material;
   a second substrate having a bottom surface disposed opposing the top surface of the first substrate, the second substrate being formed of high-resistivity material to prevent a radio frequency (RF) signal emitted by the electronic circuit from being coupled to the second substrate; and
   a side wall disposed between and in contact with the top surface of the first substrate and the bottom surface of the second substrate, the side wall defining a cavity together with the top surface of the first substrate and the bottom surface of the second substrate, the cavity internally including the electronic circuit, the side wall including a first side wall and a second sidewall sequentially stacked and bonded by transient liquid phase bonding, the first side wall formed of gold-tin (Au—Sn) alloy and the second side wall formed of tin-copper (Sn—Cu) alloy.

2. A duplexer comprising:
a reception filter configured to allow a first frequency to pass through; and
a transmission filter configured to allow a second frequency to pass through, at least one of the reception filter and the transmission filter being the electronic device of claim 1.

3. A communication device comprising the duplexer of claim 2.

4. The communication device of claim 3 wherein the communication device is a mobile phone.

5. The electronic device of claim 1 further comprising a column disposed between the top surface of the first substrate and the bottom surface of the second substrate.

6. The electronic device of claim 5 wherein the column is formed of metal.

7. The electronic device of claim 5 wherein the first substrate includes a via extending through a through-hole between the top surface of the first substrate and a bottom surface of the first substrate and connecting the electronic circuit to an external electrode formed on the bottom surface of the first substrate, the column being disposed immediately above the via.

8. The electronic device of claim 1 wherein the high-resistivity material forming the second substrate includes at least one of silicon dioxide ($SiO_2$) and aluminum oxide ($Al_2O_3$).

9. The electronic device of claim 1 wherein the piezoelectric material forming the first substrate includes at least one of aluminum nitride (AlN) and zinc oxide (ZnO).

10. The electronic device of claim 1 wherein the BAW resonator includes at least one of a film bulk acoustic resonator (FBAR) and a solidly mounted resonator (SMR).

11. The electronic device of claim 1 wherein a ground line of the electronic circuit is connected to the side wall.

12. A diplexer comprising:
a first reception filter configured to receive a signal of a first frequency band; and
a second reception filter configured to receive a signal of a second frequency band different from the first frequency band, at least one of the first reception filter and the second reception filter being the electronic device of claim 1.

13. An electronic device comprising:
a first substrate having a top surface on which an electronic circuit including a bulk acoustic wave (BAW) resonator is formed, the first substrate being formed of piezoelectric material;
a second substrate having a bottom surface disposed opposing the top surface of the first substrate, the second substrate being formed of low-resistivity material;
a side wall disposed between the top surface of the first substrate and the bottom surface of the second substrate, the side wall defining a cavity together with the top surface of the first substrate and the bottom surface of the second substrate, the cavity internally including the electronic circuit; and
a thin film of high-resistivity material entirely covering the bottom surface of the second substrate to prevent a radio frequency (RF) signal emitted by the electronic circuit from being coupled to the second substrate.

14. The electronic device of claim 13 wherein the side wall is formed of metal and connected to the second substrate via the thin film.

15. The electronic device of claim 14 wherein the side wall is formed by transient liquid phase bonding.

16. The electronic device of claim 14 wherein a ground line of the electronic circuit is connected to the side wall.

17. The electronic device of claim 13 further comprising a column disposed between the top surface of the first substrate and the bottom surface of the second substrate.

18. The electronic device of claim 17 wherein the column is formed of metal and connected to the second substrate via the thin film.

19. The electronic device of claim 17 wherein the first substrate includes a via extending through a through-hole between the top surface of the first substrate and a bottom surface of the first substrate and connecting the electronic circuit to an external electrode formed on the bottom surface of the first substrate, the column being disposed immediately above the via.

20. The electronic device of claim 13 wherein the low-resistivity material forming the second substrate includes silicon and the high-resistivity material forming the thin film includes at least one of silicon dioxide ($SiO_2$) and aluminum oxide ($Al_2O_3$).

21. The electronic device of claim 13 wherein the piezoelectric material forming the first substrate includes at least one of aluminum nitride (AlN) and zinc oxide (ZnO).

22. The electronic device of claim 13 wherein the bulk acoustic wave resonator includes at least one of a film bulk acoustic resonator (FBAR) and a solidly mounted resonator (SMR).

23. A method of manufacturing an electronic device, the method comprising:
forming an electronic circuit including a bulk acoustic wave (BAW) resonator on a top surface of a first substrate formed of piezoelectric material;
forming a thin film entirely covering a bottom surface of a second substrate formed of low-resistivity material, the thin film being formed of high-resistivity material to prevent a radio frequency (RF) signal emitted by the electronic circuit from being coupled to the second substrate; and
forming a side wall between the top surface of the first substrate and the bottom surface of the second substrate, the side wall supporting the top surface of the first substrate and the bottom surface of the second substrate and defining a cavity internally including the electronic circuit together with the top surface of the first substrate and the bottom surface of the second substrate.

24. The method of claim 23 wherein the low-resistivity material forming the second substrate includes silicon and the high-resistivity material forming the thin film includes at least one of silicon dioxide ($SiO_2$) and aluminum oxide ($Al_2O_3$).

25. The method of claim 23 wherein the piezoelectric material forming the first substrate includes at least one of aluminum nitride (AlN) and zinc oxide (ZnO).

26. The method of claim 23 wherein the bulk acoustic wave resonator includes at least one of a film bulk acoustic resonator (FBAR) and a solidly mounted resonator (SMR).

27. The method of claim 23 wherein the side wall is formed of metal and connected to the second substrate via the thin film.

28. The method of claim 23 wherein forming the side wall includes bonding a first side wall formed on the top surface of the first substrate with a second side wall formed on the bottom surface of the second substrate by transient liquid phase bonding.

29. A method of manufacturing an electronic device, comprising:

forming an electronic circuit on a top surface of a first substrate formed of piezoelectric material, the electronic circuit including a bulk acoustic wave (BAW) resonator;

providing a second substrate formed of high-resistivity material to prevent a radio frequency (RF) signal emitted by the electronic circuit from being coupled to the second substrate; and forming a side wall between and in contact with the top surface of the first substrate and a bottom surface of the second substrate, the side wall defining a cavity together with the top surface of the first substrate and the bottom surface of the second substrate, the cavity internally including the electronic circuit, forming the side wall including bonding a first side wall formed on the top surface of the first substrate with a second side wall formed on the bottom surface of the second substrate by transient liquid phase bonding.

30. The method of claim 29 wherein the high-resistivity material forming the second substrate includes at least one of silicon dioxide ($SiO_2$) and aluminum oxide ($Al_2O_3$).

31. The method of claim 29 wherein the piezoelectric material forming the first substrate includes at least one of aluminum nitride (AlN) and zinc oxide (ZnO).

32. The method of claim 29 wherein the bulk acoustic wave resonator includes at least one of a film bulk acoustic resonator (FBAR) and a solidly mounted resonator (SMR).

* * * * *

UNITED STATES PATENT AND TRADEMARK OFFICE
CERTIFICATE OF CORRECTION

| | | |
|---|---|---|
| PATENT NO. | : 10,873,311 B2 | Page 1 of 1 |
| APPLICATION NO. | : 15/894021 | |
| DATED | : December 22, 2020 | |
| INVENTOR(S) | : Yoshiaki Ando et al. | |

It is certified that error appears in the above-identified patent and that said Letters Patent is hereby corrected as shown below:

On the Title Page

Column 1, (72) Inventors: delete "Yoshiaki Ando, Yokosuka (JP)" and insert -- Yoshiaki Ando, Yokosuka-Shi (JP) --

Signed and Sealed this
Ninth Day of February, 2021

Drew Hirshfeld
*Performing the Functions and Duties of the*
*Under Secretary of Commerce for Intellectual Property and*
*Director of the United States Patent and Trademark Office*